US007116946B2

(12) United States Patent
Tanabe et al.

(10) Patent No.: US 7,116,946 B2
(45) Date of Patent: Oct. 3, 2006

(54) TRANSMITTER

(75) Inventors: Mitsuru Tanabe, Katano (JP); Takaharu Saeki, Kyoto (JP); Yoshihisa Minami, Otsu (JP); Koichiro Tanaka, Takarazuka (JP); Noriaki Saito, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 96 days.

(21) Appl. No.: 10/522,741

(22) PCT Filed: Oct. 23, 2003

(86) PCT No.: PCT/JP03/13586

§ 371 (c)(1),
(2), (4) Date: Jan. 31, 2005

(87) PCT Pub. No.: WO2004/038937

PCT Pub. Date: May 6, 2004

(65) Prior Publication Data

US 2006/0068697 A1    Mar. 30, 2006

(30) Foreign Application Priority Data

Oct. 28, 2002   (JP)   ............................. 2002-312724

(51) Int. Cl.
H04B 1/02     (2006.01)
H04B 1/04     (2006.01)
H01Q 11/12    (2006.01)

(52) U.S. Cl. ...................................... 455/91; 455/127.1

(58) Field of Classification Search ................. 455/91, 455/127.1, 571, 73, 108, 116, 110; 330/270, 330/11, 290, 297; 375/145, 330, 297, 295
See application file for complete search history.

(56) References Cited

U.S. PATENT DOCUMENTS

| 4,831,334 A | 5/1989 | Hudspeth et al. |
| 6,256,482 B1 | 7/2001 | Raab |
| 2004/0185803 A1* | 9/2004 | Tanabe et al. .............. 455/108 |

(Continued)

FOREIGN PATENT DOCUMENTS

EP          1037443         9/2000

(Continued)

OTHER PUBLICATIONS

PCT International Search Report dated Feb. 17, 2004.

*Primary Examiner*—Aung Moe
(74) *Attorney, Agent, or Firm*—Stevens, Davis, Miller & Mosher, LLP

(57) ABSTRACT

The present invention provides a transmitter conforming to the EER method in a wide frequency band at high efficiency. For this purpose, the amplitude component of a modulated signal is input to the power supply terminal of a high-frequency power amplifier 130, the I and Q quadrature signals thereof are input to the high-frequency input terminal of the high-frequency power amplifier 130, and the original modulated signal is obtained from the output of the high-frequency power amplifier 130. A collector voltage is supplied from DC—DC converter group 615 having output voltages being different sequentially to an emitter follower 729 via a switch group 621. One of the outputs of the DC—DC converters 616 to 620 is selected depending on the level of the amplitude component as the collector voltage and supplied to the emitter follower, whereby the difference between the emitter voltage of he emitter follower 729 and the collector voltage of the emitter follower 729 is made smaller and the efficiency of the emitter follower 729 is raised; furthermore, the power supply voltage of the high-frequency power amplifier 130 is voltage-converted by the emitter follower 729, whereby operation in a wide frequency band is made possible.

26 Claims, 12 Drawing Sheets

U.S. PATENT DOCUMENTS

| | | |
|---|---|---|
| 2005/0118965 A1* | 6/2005 | Tanabe et al. ........... 455/127.1 |
| 2005/0136854 A1* | 6/2005 | Akizuki et al. ............... 455/91 |
| 2005/0202789 A1* | 9/2005 | Tanabe et al. ............. 455/110 |
| 2005/0215209 A1* | 9/2005 | Tanabe et al. ........... 455/127.1 |

FOREIGN PATENT DOCUMENTS

| | | |
|---|---|---|
| JP | 62274906 | 11/1987 |
| JP | 2000 269920 | 9/2000 |
| JP | 2001 156554 | 6/2001 |
| WO | 8810025 | 12/1988 |
| WO | 0158012 | 8/2001 |
| WO | 0167593 | 9/2001 |

* cited by examiner

TRANSMITTER

TECHNICAL FIELD

The present invention relates to a wireless transmitter for use in a communication system that uses subcarriers, such as OFDM (Orthogonal Frequency Division Multiplex).

BACKGROUND TECHNOLOGY

In a modulated signal subjected to voltage conversion, in particular, a modulated signal subjected to multi-level modulation, such as QAM (Quadrature Amplitude Modulation), linear operation is required in a high-frequency power amplifier for transmitting power to an antenna. Hence, class A or class AB has been used as the operation class of the high-frequency power amplifier.

However, as broadband communication is promoted, a communication system that uses subcarriers, such as OFDM (Orthogonal Frequency Division Multiplex), has begun to be used; hence the conventional class-A or class-AB high-frequency power amplifier cannot be expected to attain high efficiency. In other words, in OFDM, subcarriers are overlapping, whereby high power is generated instantaneously at random. That is to say, the ratio PAPR (Peak to Average Power Ratio) of the instantaneous maximum power to average power is high. Hence, in order that a high-frequency signal having this kind of high power can also be amplified linearly, it is necessary to hold high DC power at all times. The power efficiency of the class-A operation is only 50% at the maximum; in particular, in the case of OFDM, since PAPR is high, the power efficiency is only about 10%.

For this reason, in the case of a portable wireless transmitter wherein batteries are used as a power supply, its operable time is short, thereby causing a problem in practical use.

In order to solve this kind of problem, the conventional EER (Envelope Elimination and Restoration) method has been proposed, which is known as Kahn's method (for example, see U.S. Pat. No. 6,256,482B1 (FIG. 6 on page 3 of the drawings)).

FIG. 6 is a block diagram showing the schematic configuration of the EER method. In FIG. 6, a high-frequency modulated signal 46, such as a QAM signal, input to a terminal 40, is divided into two branches; in one of the branches, the modulated wave 46 is subjected to envelope detection by a detector 41, whereby an amplitude component signal is generated. A power supply voltage Vdd is voltage-converted by a voltage converter (an amplifier for amplifying the amplitude component) 42. At this time, a class-S amplifier (a switching regulator or the like) capable of operating at high efficiency (up to 95%) is used as the voltage converter 42. In the other branch, the amplitude of the modulated wave 46 is controlled by an amplitude control amplifier (limiter 43), whereby a modulated wave having only phase information is obtained. The modulated wave having the phase information is input to the RF input terminal of a switch-type amplifier 44, whereby, for example, the gate voltage of a field-effect transistor, an element of the switch-type amplifier 44, is modulated.

The switch-type amplifier is herein a class-F amplifier wherein harmonics are controlled so that the waveform of the drain voltage becomes rectangular, or a class-E or class-D amplifier wherein load conditions are optimized so that the waveform of the drain voltage and the waveform of the drain current do not overlap each other.

The conventional class-A amplifier has a period in which the drain voltage and the drain current are generated simultaneously, thereby consuming power. On the other hand, in the switch-type amplifier 44, such a period in which the drain voltage and the drain current are generated simultaneously is made as short as possible, whereby power consumption can be reduced.

When a DC power of 200 mA and 3 V is supplied, for example, the DC power is 600 mW. When the switch-type amplifier 44 is OFF, no current flows and only the voltage Vdd is applied; hence DC power consumption is zero. On the other hand, when ON, a current of 200 mA flows; however, since the transistor conducts completely, the voltage VDS between the drain and the source can be assumed to be about 0.3 V at most. In this case, a DC power of 0.3×0.2=0.06 W, that is, 60 mW, is consumed inside the transistor. The power efficiency reaches a very high value of (600 −60)/600=90%. This effect is significant since the power efficiency of the class-A amplifier is only 50% at the maximum.

In other words, high power efficiency is attained by using the switch-type amplifier. However, since the switch-type amplifier is a nonlinear amplifier, the switch-type amplifier cannot be used because a modulated signal, such as the QAM signal, in which the amplitude level of the modulated wave changes, is required to be amplified linearly.

In order to solve this problem, the EER method separates a signal including amplitude information into an amplitude component and a phase component, and only the phase component is amplified by the switch-type amplifier. When the amplitude component is input to the power supply terminal of the switch-type amplifier, output power proportionate to the amplitude component is obtained; hence, a signal including the original amplitude information is reproduced eventually.

With this configuration, a highly efficient amplifier, such as the switch-type amplifier, although nonlinear, can be used, whereby high efficiency can be attained.

However, since the frequency band of the voltage converter 42 (for example, a switching regulator) for modulating the amplitude component is 5 MHz at most, the conventional EER method cannot be used in the modulated wave frequency band width of 20 MHz stipulated in the IEEE802.11a Standard, a wireless LAN standard.

In order that the frequency band is widened, it is necessary to decrease the inductance of the low-pass filter incorporated in the output of the voltage converter 42. However, since the Q value of the inductance is lowered, the amount of heat consumed by the inductance becomes unignorable, and the efficiency of the voltage converter 42 lowers. In addition, noise increases.

Furthermore, in the case when a series regulator is used as the voltage converter 42, the product of the amount of voltage conversion (the difference between the power supply voltage and the voltage of the amplitude component) of the series regulator and the drain current of the high-frequency power amplifier is power consumption. In OFDM, the average voltage value of the amplitude component is not more than a half of the power supply voltage; hence, high efficiency is not attained even in this case.

DISCLOSURE OF THE INVENTION

The present invention is intended to provide a transmitter capable of attaining the EER method in a wide frequency band without lowering efficiency.

In order to solve the above-mentioned problems, a transmitter in accordance with a first invention comprises modulated signal generating means for generating a modulated signal, phase/amplitude separating means for separating the modulated signal generated by the modulated signal generating means into a phase component and an amplitude component, amplitude slicing means for slicing the amplitude component separated by the phase/amplitude separating means at a plurality of voltage levels being different stepwise, a plurality of switching regulators for converting the power supply voltage into a plurality of voltages having different values stepwise, a switch group for selecting one of the output voltages of the plurality of switching regulators, a switch driver for selectively conducting each switch of the switch group according to the slice data of the amplitude component sliced by the amplitude slicing means, linear voltage converting means for voltage-converting the amplitude component by using the output voltage of one of the switching regulators selected by the switch group as the power supply voltage, and a high-frequency power amplifier for receiving the phase component at the high-frequency input terminal thereof, for receiving the amplitude component voltage-converted by the linear voltage converting means at the power supply terminal thereof and for, as a result, outputting a modulated wave in which amplitude and phase are multiplied.

With this configuration, the invention adopts a configuration wherein the plurality of switching regulators for converting the power supply voltage into the plurality of voltages having different values stepwise are provided, one of the switching regulators is selected depending on the level of the amplitude component, and the linear voltage converting means voltage-converts the amplitude component by using the output voltage of the selected switching regulator as the power supply voltage. Hence, the voltage drop due to the linear voltage converting means can be lowered, whereby the loss due to the switching regulators can be decreased, and the power loss due to the linear voltage converting means can also be decreased. Furthermore, since the linear voltage converting means is used for the voltage conversion, it is not necessary to use a low-pass filter at its output section, whereby broadband can be attained. Therefore, it is possible to attain the EER method in a wide frequency band without lowering efficiency.

A transmitter in accordance with a second invention comprises modulated signal generating means for generating a modulated signal, phase/amplitude separating means for separating the modulated signal generated by the modulated signal generating means into a phase component and an amplitude component, amplitude slicing means for slicing the amplitude component separated by the phase/amplitude separating means at a plurality of voltage levels being different stepwise, a plurality of switching regulators for converting the power supply voltage into a plurality of voltages having different values stepwise, a plurality of linear voltage converting means for voltage-converting the amplitude component by using each of the output voltages of the plurality of switching regulators as the power supply voltage, a switch group for transmitting the amplitude component to the plurality of linear voltage converting means, a switch driver for selectively conducting each switch of the switch group according to the slice data of the amplitude component sliced by the amplitude slicing means, and a high-frequency power amplifier for receiving the phase component at the high-frequency input terminal thereof, for receiving the amplitude component voltage-converted by the plurality of linear voltage converting means at the power supply terminal thereof and for, as a result, outputting a modulated wave in which amplitude and phase are multiplied.

With this configuration, the plurality of switching regulators for converting the power supply voltage into the plurality of voltages having different values stepwise are provided, the amplitude component is voltage-converted by each of the plurality of linear voltage converting means by using each of the output voltages of the plurality of switching regulators as the power supply voltage, and the selection of one of the plurality of linear voltage converting means depending on the level of the amplitude component is made effective. Hence, the voltage drop due to the linear voltage converting means at the time when the voltage conversion is carried out can be lowered, whereby the loss due to the switching regulators can be decreased, and the power loss due to the linear voltage converting means can also be decreased. Furthermore, since the linear voltage converting means is used for the voltage conversion, it is not necessary to use a low-pass filter at its output section, whereby broadband can be attained. Therefore, it is possible to attain the EER method in a wide frequency band without lowering efficiency. Furthermore, only the linear voltage converting means is provided between the switching regulators and the high-frequency power amplifier, and the switching means are disconnected from the path, whereby the power loss can be lowered further in comparison with the configuration of the first invention.

In the transmitter in accordance with the above-mentioned first or second invention, frequency converting means may be provided between the phase component output terminal of the phase/amplitude separating means and the input terminal of the high-frequency power amplifier.

With this configuration, the following operation-effect is obtained. Since the frequency band of the phase/amplitude separating means is several hundred MHz at most, in the case when the carrier wave has a frequency exceeding 1 GHz, this cannot be processed; however, the frequency of the carrier wave can be up-converted easily by using frequency converting means, such as a quadrature modulator.

It is preferable that the transmitter in accordance with the above-mentioned first or second invention preferably further comprises feedback means, provided at the output terminal of the high-frequency power amplifier, for feeding back the high-frequency output power, first timing correcting means for generating a first correction signal for correcting the timing deviation of phase and amplitude on the basis of the signal of the feedback means, and first timing amending means for receiving the first correction signal from the first timing correcting means and for amending the timing of the amplitude component and the phase component output from the phase/amplitude separating means.

With this configuration, the following operation-effect is obtained. If the timing of the phase component and the amplitude component is deviated by a delay due to the layout from the input of each modulated wave component to the output of the high-frequency power amplifier or a delay due to the wiring length and parasitic components of transistors, the modulated wave cannot be formed properly by using the output of the high-frequency power amplifier. However, since the feedback means, the timing correcting means and the timing amending means are provided, the timing of the phase component and the voltage-converted wave component can be amended accurately, whereby the modulated wave can be formed properly by using the output of the high-frequency power amplifier.

It is preferable that the transmitter in accordance with the above-mentioned first or second invention further comprises first voltage detecting means, provided between the output terminal of the switching regulator and the power supply voltage input terminal of the linear voltage converting means, for detecting the output voltage of the switching regulator, second voltage detecting means, provided at the amplitude component input terminal of the linear voltage converting means, for detecting the voltage of the amplitude component, second timing correcting means for outputting a second correction signal for correcting the timing deviation of the amplitude component and the slice data by using the voltage amplitude data obtained from the first and second voltage detecting means, and second timing amending means for receiving the second correction signal from the second timing correcting means and for amending the timing of the amplitude component and the slice data.

With this configuration, the following operation-effect is obtained. If the timing of the amplitude slice data and the amplitude component is deviated by a delay due to the layout from each input of the amplitude slice data and the amplitude component to the output of the high-frequency power amplifier or a delay due to the wiring length and parasitic components of transistors, the output of the switching regulator conducted by the switch driven according to the slice data is deviated from the value of the amplitude component, whereby an unnecessarily large voltage drop occurs at the linear voltage converting means and power efficiency is lowered or the linear voltage converting means is turned OFF. However, since the first and second voltage detecting means, the second timing correcting means and the second timing amending means are provided, the timing of the amplitude slice data and the amplitude component can be amended accurately, whereby ideal power efficiency can be attained.

In the transmitter in accordance with the above-mentioned first or second invention, the linear voltage converting means comprises an emitter follower, for example.

With this configuration, the amplitude component is converted into a voltage lower than that by a constant voltage level (for example, 0.7 V) between the emitter and the base, which is determined by the built-in potential of the P-N junction; furthermore, since no feedback loop is provided, frequency band limitation owing to a loop does not occur, and the configuration is simplified.

In the transmitter in accordance with the above-mentioned first or second invention, the linear voltage converting means may comprise a linear regulator.

With this configuration, the voltage level can be controlled accurately by a feedback loop, whereby the amplitude component can be voltage-converted properly.

It is preferable that the transmitter in accordance with the above-mentioned first or second invention has a configuration wherein the amplitude component is input to an operational amplifier, the output of the operational amplifier is connected to the input of the emitter follower, and the output of the emitter follower is fed back negatively to the operational amplifier.

With this configuration, the nonlinearity and the temperature characteristic of the emitter follower can be compensated, and the amplitude component can be transmitted properly to the high-frequency power amplifier.

The transmitter in accordance with the above-mentioned first or second invention may have a configuration wherein the emitter follower is formed of a push-pull circuit, the amplitude component is input to an operational amplifier, the output of the operational amplifier is connected to the input of the push-pull circuit, and the output of the push-pull circuit is fed back negatively to the operational amplifier.

With this configuration, the nonlinearity and the temperature characteristic of the emitter follower can be compensated, voltage holding at the positive or negative power supply voltage supplied to the operational amplifier owing to the transient characteristic of the operational amplifier can be prevented, and the amplitude component can be transmitted properly to the high-frequency power amplifier.

A transmitter in accordance with a third invention comprises modulated signal generating means for generating a modulated signal, amplitude extracting means for extracting an amplitude component from the modulated signal generated by the modulated signal generating means, amplitude slicing means for slicing the amplitude component extracted by the amplitude extracting means at a plurality of voltage levels being different stepwise, a plurality of switching regulators for converting the power supply voltage into a plurality of voltages having different values stepwise, a switch group for selecting one of the output voltages of the plurality of switching regulators, a switch driver for selectively conducting each switch of the switch group according to the slice data of the amplitude component sliced by the amplitude slicing means, linear voltage converting means for voltage-converting the amplitude component by using the output voltage of one of the switching regulators selected by the switch group as the power supply voltage, and a high-frequency power amplifier for receiving the above-mentioned modulated signal at the high-frequency input terminal thereof, for receiving the amplitude component voltage-converted by the above-mentioned linear voltage converting means at the power supply terminal thereof and for, as a result, outputting a modulated wave.

With this configuration, the invention adopts a configuration for carrying out voltage conversion wherein the plurality of switching regulators for converting the power supply voltage into the plurality of voltages having different values stepwise are provided, one of the switching regulators is selected depending on the level of the amplitude component, and the linear voltage converting means voltage-converts the amplitude component by using the output voltage of the selected switching regulator as the power supply voltage. Hence, the voltage drop due to the linear voltage converting means at the time of the voltage conversion can be lowered, whereby the loss due to the switching regulators can be decreased, and the power loss due to the linear voltage converting means can also be decreased. Furthermore, since the linear voltage converting means is used for the voltage conversion, it is not necessary to use a low-pass filter at its output section, whereby broadband can be attained. Therefore, it is possible to attain the EER method in a wide frequency band without lowering efficiency.

Moreover, since the modulated signal is directly used instead of the phase component, it is possible to avoid the deterioration of error vector magnitude (EVM), which was inevitable in the EER method wherein the modulated signal is separated into the amplitude and phase components. In other words, in the case when the phase component is used, the phase component is filtered in a range allowable by the frequency band of a digital-analog converter and to an extent not affecting EVM; however, a partial level reduction in the phase component owing to the filtering causes significant deterioration in EVM when the phase component is combined with the amplitude component at the output of the high-frequency amplifier. In addition, since the required frequency band width of the modulated signal is less than that of the phase component separated from the modulated signal by about ⅙, the frequency band width of the digital-analog converter or an anti-alias filter for suppressing spurious components caused by digital-analog conversion can be narrowed. Hence, this is advantageous in decreasing the power consumption of the digital-analog converter and reducing the size and cost of the inductor for use in a filter.

Furthermore, in the conventional EER method, since an input level, at which the high-frequency power amplifier can be saturated sufficiently even when the peak power is input, is introduced, in the case when the isolation characteristic (the ratio of leakage from the input power in the output power) at the time when the high-frequency power amplifier is OFF (the amplitude component is zero) is not good, power having a level higher than the expected level is output and multiplied with the amplitude component; as a result, the modulated wave cannot be formed properly at the output of the high-frequency power amplifier (the EVM performance deteriorates). However, in this configuration, when the high-frequency power amplifier is OFF (the amplitude component is zero), the power to be input to the high-frequency power amplifier is also zero, whereby the modulated wave can be formed properly at the output of the high-frequency power amplifier without depending on the isolation characteristic.

A transmitter in accordance with a second invention comprises modulated signal generating means for generating a modulated signal, amplitude extracting means for extracting an amplitude component from the modulated signal generated by the modulated signal generating means, amplitude slicing means for slicing the amplitude component extracted by the amplitude extracting means at a plurality of voltage levels being different stepwise, a plurality of switching regulators for converting the power supply voltage into a plurality of voltages having different values stepwise, a plurality of linear voltage converting means for voltage-converting the amplitude component by using each of the output voltages of the plurality of switching regulators as the power supply voltage, a switch group for transmitting the amplitude signal to the plurality of linear voltage converting means, a switch driver for selectively conducting each switch of the switch group according to the slice data of the amplitude component sliced by the amplitude slicing means, and a high-frequency power amplifier for receiving the above-mentioned modulated signal at the high-frequency input terminal thereof, for receiving the amplitude component voltage-converted by the above-mentioned linear voltage converting means at the power supply terminal thereof and for, as a result, outputting a modulated wave.

With this configuration, the plurality of switching regulators for converting the power supply voltage into the plurality of voltages having different values stepwise are provided, each of the plurality of linear voltage converting means voltage-converts the amplitude component by using each of the output voltages of the plurality of switching regulators as the power supply voltage to carry out voltage conversion, and the selection of one of the plurality of linear voltage converting means depending on the level of the amplitude component is made effective. Hence, the voltage drop due to the linear voltage converting means at the time when the voltage conversion is carried out can be lowered, whereby the loss due to the switching regulators can be decreased, and the power loss due to the linear voltage converting means can also be decreased. Furthermore, since the linear voltage converting means is used for the voltage conversion, it is not necessary to use a low-pass filter at its output section, whereby broadband can be attained. Therefore, it is possible to attain the EER method in a wide frequency band without lowering efficiency. Furthermore, only the linear voltage converting means is provided between the switching regulators and the high-frequency power amplifier, and the switching means are disconnected from the path, whereby the power loss can be lowered further in comparison with the configuration of the third invention.

Moreover, since the modulated signal is directly used instead of the phase component, it is possible to avoid the deterioration of error vector magnitude (EVM), which was inevitable in the EER method wherein the modulated signal is separated into the amplitude and phase components. In other words, in the case when the phase component is used, the phase component is filtered in a range allowable by the frequency band of a digital-analog converter and to an extent not affecting EVM; however, a partial level reduction in the phase component owing to the filtering causes significant deterioration in EVM when the phase component is combined with the amplitude component at the output of the high-frequency amplifier. In addition, since the required frequency band width of the modulated signal is less than that of the phase component separated from the modulated signal by about ⅙, the frequency band width of the digital-analog converter or an anti-alias filter for suppressing spurious components caused by digital-analog conversion can be narrowed. Hence, this is advantageous in decreasing the power consumption of the digital-analog converter and reducing the size and cost of the inductor for use in a filter.

Furthermore, in the conventional EER method, since an input level, at which the high-frequency power amplifier can be saturated sufficiently even when the peak power is input, is introduced, in the case when the isolation characteristic at the time when the high-frequency power amplifier is OFF (the amplitude component is zero) is not good, power having a level higher than the expected level is output and multiplied with the amplitude component; as a result, the modulated wave cannot be formed properly at the output of the high-frequency power amplifier (the EVM performance deteriorates). However, in this configuration, when the high-frequency power amplifier is OFF (the amplitude component is zero), the power to be input to the high-frequency power amplifier is also zero, whereby the modulated wave can be formed properly at the output of the high-frequency power amplifier without depending on the isolation characteristic.

In the transmitter in accordance with the above-mentioned third or fourth invention, the linear voltage converting means comprises an emitter follower, for example.

With this configuration, the amplitude component is converted into a voltage lower than that by a constant voltage level (for example, 0.7 V) between the emitter and the base, which is determined by the built-in potential of the P-N junction; furthermore, since no feedback loop is provided, frequency band limitation owing to a loop does not occur, and the configuration is simplified.

In the transmitter in accordance with the above-mentioned third or fourth invention, the linear voltage converting means may comprise a linear regulator.

With this configuration, the voltage level can be controlled accurately by a feedback loop, whereby the amplitude component can be level-converted properly.

It is preferable that the transmitter in accordance with the above-mentioned third or fourth invention has a configuration wherein the amplitude component is input to an operational amplifier, the output of the operational amplifier is connected to the input of the emitter follower, and the output of the emitter follower is fed back negatively to the operational amplifier.

With this configuration, the nonlinearity and the temperature characteristic of the emitter follower can be compensated, and the amplitude component can be transmitted properly to the high-frequency power amplifier.

The transmitter in accordance with the above-mentioned third or fourth invention may have a configuration wherein the emitter follower is formed of a push-pull circuit, the amplitude component is input to an operational amplifier, the output of the operational amplifier is connected to the input of the push-pull circuit, and the output of the push-pull circuit is fed back negatively to the operational amplifier.

With this configuration, the nonlinearity and the temperature characteristic of the emitter follower can be compensated, voltage holding at the positive or negative power supply voltage supplied to the operational amplifier owing to the transient characteristic of the operational amplifier can be prevented, and the amplitude component can be transmitted properly to the high-frequency power amplifier.

In accordance with the present invention as described above in detail, in the EER method capable of operating the high-frequency power amplifier as a switch type, highly efficient operation is made possible in a wide frequency band.

BEST MODES FOR CARRYING OUT THE INVENTION

Figure 1:
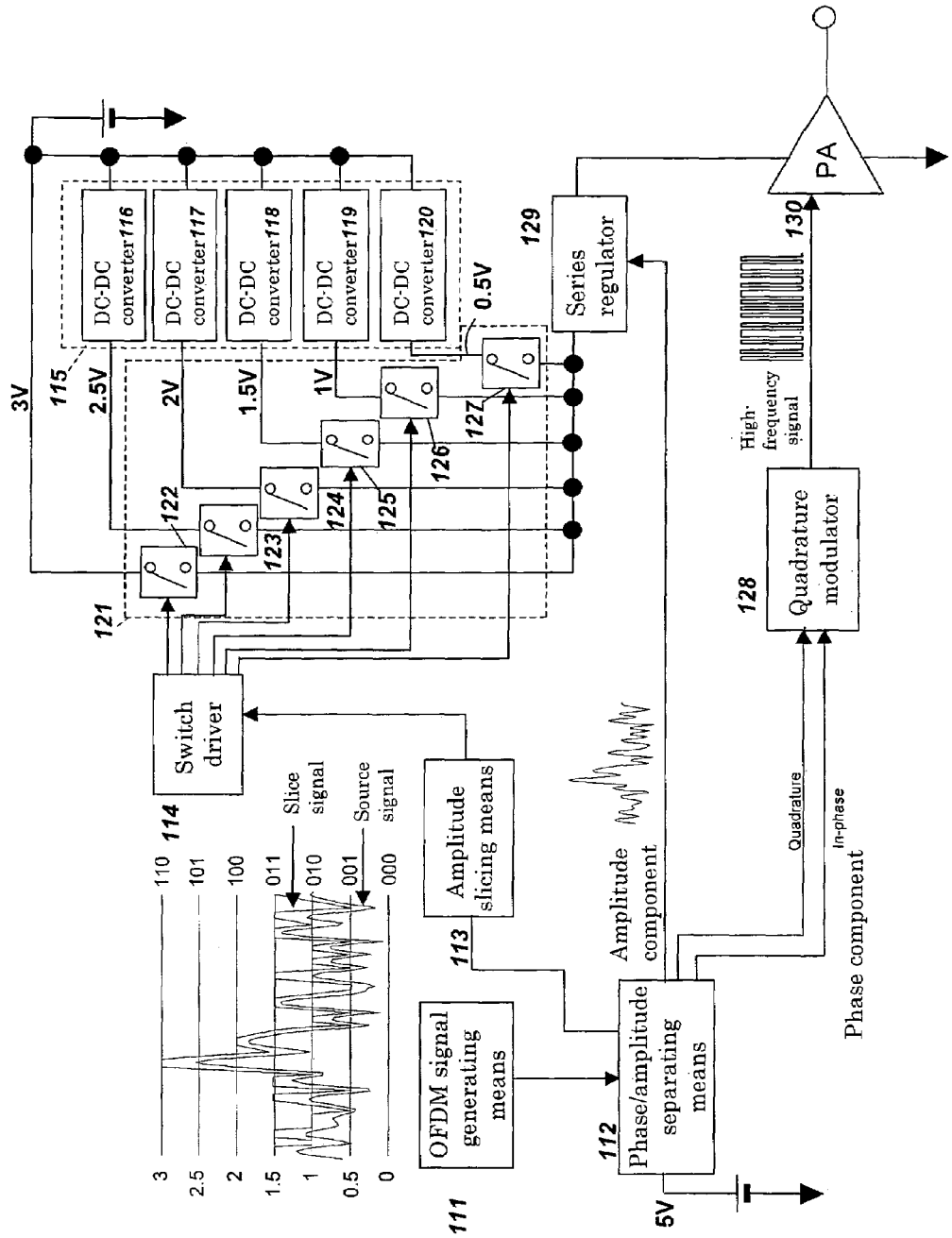
FIG. 1 is a block diagram showing the configuration of a transmitter in accordance with Embodiment 1 of the present invention.

Embodiments in accordance with the present invention will be described below referring to the drawings.

Embodiment 1

Embodiment 1 in accordance with the present invention will be described below referring to the drawing. In this embodiment, the wireless LAN system according to the IEEE802.11a Standard, wherein a wideband modulated signal is used, is taken as an example and explained. In the wireless LAN system, each of 52 quadrature subcarriers is subjected to 64-QAM modulation, and these are added to obtain a modulated signal. The 52 subcarriers are respectively spaced 312.5 kHz apart, thereby occupying 52×312.5=16.25 MHz.

FIG. 1 is a circuit diagram of a transmitter in accordance with Embodiment 1 of the present invention for attaining the EER method. As shown in FIG. 1, this transmitter comprises OFDM signal generating means 111, phase/amplitude separating means 112, amplitude slicing means 113, a switching regulator group 115, a switch group 121, a switch driver 114, a quadrature modulator 128, a series regulator 129, and a switch-type high-frequency power amplifier 130.

The above-mentioned OFDM signal generating means 111 generates an OFDM signal and corresponds to modulated signal generating means for generating a modulated signal.

The phase/amplitude separating means 112 receives a power supply voltage of 5 V, for example, and separates the OFDM signal generated by the OFDM signal generating means 111 into a phase component and an amplitude component.

The amplitude slicing means 113 slices the amplitude component separated by the phase/amplitude separating means 112 at a plurality of suitable voltage levels being different stepwise. As these voltage levels, 0.5, 1.0, 1.5, 2.0 and 2.5 are set, for example. FIG. 1 shows the amplitude component that is input to the amplitude slicing means 113, that is, a source signal, and the output signal of the amplitude slicing means 113, that is, a slice signal.

The relationship between the source signal and the slice signal shown in FIG. 1 will be described herein. The amplitude slicing means 113 detects the level of the amplitude component as shown in FIG. 1, compares the level with a preset voltage level, and slices the amplitude component as shown in FIG. 1.

In an amplitude slicing method, for example, if the amplitude component is in the range of 0.5 V<the amplitude component≦1.0 V, it is rounded to 1 V; if 1 V<the amplitude component≦1.5 V, it is rounded to 1.5 V; and so on; the level is rounded to the maximum value in the range including the level. In the figure, seven levels in total are present; hence, these are assigned to 3-bit data, and 3-bit slice data is output to the switch driver 114.

The switching regulator group 115 comprises a plurality of, for example, four switching regulators to which a power supply voltage of 3 V, for example, is input, i.e., four DC—DC converters 116 to 120. The DC—DC converters 116 to 120 convert the power supply voltage into a plurality of voltages having different values stepwise. More specifically, the DC—DC converters 116 to 120 convert a voltage of 3 V into respective voltages of 2.5 V, 2.0 V, 1.5 V, 1.0 V and 0.5 V.

The switch group 121 comprises, for example, five switches 122 to 127, one of which is conducted selectively, thereby selecting one of 3 V serving as the power supply voltage, 2.5 V, 2.0 V, 1.5 V, 1.0 V and 0.5 V serving as the output voltages of the plurality of DC—DC converters 116 to 120. The switches 122 to 127 are each formed of a MOS transistor, for example.

The switch driver 114 selectively conducts each of the switches 122 to 127 of the switch group 121 according to the slice data of the amplitude component sliced by the amplitude slicing means 113.

The quadrature modulator 128 converts the phase component (comprising a quadrature component and an in-phase component) output from the phase/amplitude separating means 112 into a high-frequency signal, thereby corresponding to frequency converting means.

The series regulator (linear regulator) 129 operates by using one of the power supply voltage of 3 V and the output voltages of the DC—DC converters 116 to 120, selected by the switch group 121, as the power supply voltage, and converts the voltage of the amplitude component of the OFDM signal, thereby corresponding to linear voltage converting means.

The high-frequency power amplifier (PA) 130 is a switch type; the high-frequency signal (obtained by high-frequency converting the phase component) input from the quadrature modulator 128 is input to the high-frequency input terminal, and the amplitude component subjected to voltage conversion by the series regulator 129 is input to the power supply terminal; as a result, a modulated wave, which is subjected to modulation with respect to both phase and amplitude, that is, the amplitude and the phase of which are multiplied, is output.

The operation will be described below. In this embodiment, a system operating on a power supply voltage of 3 V is assumed to be used.

The OFDM signal generated by the OFDM signal generating means 111 is separated by the phase/amplitude separating means 112 into the amplitude component and the phase component, and then output. On the basis of the amplitude component having been output, the amplitude slicing means 113 generates drive information for ON/OFF driving the switches 122 to 127 of the switch group 121. The drive information is hereafter referred to as slice data.

In the amplitude slicing method, for example, if the amplitude component is in the range of 0 V<the amplitude component≦0.5 V, it is rounded to 0.5 V;

if 0.5 V<the amplitude component≦1.0 V, it is rounded to 1.0 V;

if 1.0 V<the amplitude component≦1.5 V, it is rounded to 1.5 V;

if 1.5 V<the amplitude component≦2.0 V, it is rounded to 2.0 V;

if 2.0 V<the amplitude component≦2.5 V, it is rounded to 2.5 V; and if 2.5 V<the amplitude component≦3.0 V, it is rounded to 3.0 V; in this way, a threshold value range in which the amplitude component is included is detected, and the level is rounded to the maximum value in the range including the level.

The rounding is carried out as described next. The DC—DC converters 116 to 120 are prepared so as to output the same output voltages (2.5 V, 2.0 V, 1.5 V, 1.0 V and 0.5 V) as the voltage levels obtained by the rounding. According to the level of the amplitude component, the amplitude slicing means 113 gives information as to the output of which DC—DC converter (116, 117, 118, 119 or 120) should be made active to the switch driver 114. According to the given information, the switch driver 114 selectively turns ON/OFF the switches 122 to 127 provided in the output stages of the DC—DC converters 116 to 120, thereby outputting the voltage corresponding to the voltage obtained by the rounding.

More specifically, when the amplitude component is 1.2 V, the path of the DC—DC converter 118 is turned ON, and a voltage of 1.5 V is applied to the voltage input terminal of the series regulator 129. Similarly, when the amplitude component is 1.6 V, the path of the DC—DC converter 117 is turned ON, and a voltage of 2.0 V is applied to the voltage input terminal of the series regulator 129.

The amplitude component output from the phase/amplitude separating means 112 is input to the reference input terminal of the series regulator 129, whereby the output voltage of the series regulator 129 is modulated. At this time, the amplitude component is not required to be offset since the series regulator 129 has a feedback loop therein.

Furthermore, it is preferable that the amplitude component is output in a form synchronized with the slice data.

If the amplitude component is not synchronized with the slice data at this time, an unnecessarily large voltage drop occurs, whereby the power loss increases.

By attaining the above-mentioned operation, the voltage drop (the voltage difference between the output of the DC—DC converter and the output of the series regulator) of the series regulator 129 is held at a small value, whereby the power loss due to the series regulator 129 is lowered.

Furthermore, since the phase component is required to be frequency-converted into a modulated wave, it is input as I (in-phase) and Q (quadrature) signals to the quadrature modulator 128 and multiplied with the carrier wave.

In the high-frequency power amplifier 130, the amplitude component output from the series regulator 129 is input to the power supply terminal, and the phase component (modulated wave) output from the quadrature modulator 128 is input to the high-frequency signal input terminal. A resultant signal in which the phase component and the amplitude component are multiplied is output from the output of the high-frequency power amplifier 130, whereby a correct OFDM output is obtained.

When the amplitude component and the phase component are multiplied by the high-frequency power amplifier 130, it is preferable that the timing is not deviated.

Effects expected by the above-mentioned operation will be described below.

It is assumed that the power loss at the DC—DC converters 116 to 120 is 96% and that the voltage drop of the switches 122 to 127 is 0.1 V. These values are based on the data of components actually available in the market. Furthermore, it is assumed that the efficiency of the switch-type high-frequency power amplifier 130 is 80%.

In the case of the wireless LAN IEEE802.11a Standard, it can be assumed that the average output power is 13 dBm (20 mW); at this time, the peak power is the average power plus 7 dB, that is, 20 dB (100 mW). Hence, the high-frequency power amplifier 130 is required to output the peak power of 20 dBm. When it is assumed that the power efficiency (RF output power/applied DC power) of the high-frequency power amplifier 130 is 80%, the DC power PDC becomes 125 mW when the AC power PAC is the peak power of 100 mW (20 dBm). When the power supply voltage is 3 V at this time, a current of 41.7 mA is required at the peak time. The power supply voltage required for the high-frequency power amplifier 130 at the time of the average power is 1.3 V;

however, since the DC power PDC is 25 mW when the average output power of the AC power PAC is 20 mW (13 dBm), a current of 19.2 mA is required.

The efficiency at the time of the average power, that is, an output of 20 mW, will be examined as described below.

When the power loss of the power supply section is examined, first, since the slice data is divided at intervals of 0.5 V, the voltage drop at the series regulator 129 is 0.5 V at the maximum; furthermore, when it is assumed that the saturation voltage VCE between the collector and the emitter of each of the switches (NPN transistors) 122 to 127 constituting the switch group 121 is 0.1 V, the power loss at the switch group 121 and the series regulator 129 is calculated as: 19.2 mA×0.6 V=11.5 mW.

In addition, since the power loss of the DC—DC converters 116 to 120 is 4%, the power loss at the DC—DC converters 116 to 120 is calculated as:

25 mW×0.04=1.0 mW.

Hence, the total power loss of the switch group 121, the series regulator 129 and the DC—DC converters 116 to 120 is calculated as:

11.5 mW+1.0 mW=12.5 mW.

As a result, the total efficiency at the time of the peak power is calculated as:

20 mW/(25 mW+12.5 mW)=53.3%.

The efficiency can be improved significantly in comparison with 10% at most in the case wherein an ordinary linear amplifier is used.

Furthermore, the voltage conversion section, wherein a DC—DC converter was conventionally used for modulation or the like, is configured so as to comprise the switching regulator group (DC—DC converters 116 to 120) for outputting constant voltages and the series regulator 129, whereby broadband, which was difficult to be attained by using only the DC—DC converter, can be attained. The reasons are described below.

In other words, the series regulator 129 is not required to be provided with a low-pass filter that limits a frequency band; hence, the problem wherein the frequency band is inevitably limited by the low-pass filter is solved, whereby the frequency band is limited only by the frequency bands determined by the other factors, for example, the characteristics of the transistors in the series regulator 129, the phase delay due to the feedback loop, etc.

These limiting factors can allow a frequency band far wider than the conventional frequency band of 5 MHz to be attained, whereby the frequency band can sufficiently include a modulation band of up to 20 MHz for wireless LAN or the like.

In addition, a band-limiting filter may be provided at the output of the high-frequency power amplifier 130.

Furthermore, the DC—DC converters 116 to 120 are those provided with a low-pass filter at the output. With this configuration, a low-pass filter for suppressing spurious components outside the range of the modulation frequency band may be provided between the output of the series regulator 129 and the power supply terminal of the high-frequency power amplifier 130.

Although it is preferable that the amplitude component is synchronized with the amplitude slice data as described above, no problem occurs provided that the output voltage of the series regulator 129 is adjusted so as not to be larger than the output voltages of the DC—DC converters 116 to 120. Furthermore, for example, the slice data may be provided with a time allowance in advance so that the above-mentioned state does not occur even when there is a slight deviation in timing.

In addition, although it is preferable that the amplitude component and the phase component are input to the high-frequency power amplifier 130 in a synchronized state as described above, if the timing is deviated, the error vector magnitude of the transmission output becomes worse, thereby not satisfying the wireless standard. Hence, it is necessary to align the timing as much as possible by using the following methods.

A first method is a method wherein the timing is adjusted only at the time of production. With this method, it is not necessary to provide a feedback circuit or the like in the wireless circuit, whereby the circuit can be simplified. However, synchronization may not be attained depending on the usage environment.

A second method is a method wherein the timing is adjusted only at the power ON time. This method can be adapted to the environment provided at the power ON time, thereby attaining more reliable synchronization than the first method. However, this causes a problem wherein communication cannot be carried out during the time required for correction.

In addition, in the case of TDD (Time Division Duplex), just as in the case of wireless LAN, for example, transmission and reception are repeated alternately; in this kind of wireless communication, a method wherein the timing is adjusted by using the time of switching between transmission and reception is available as a third method. This is the most ideal since it can be adapted to the environment one after another; however, the correction is required to be completed within the transmission/reception switching time stipulated in the wireless standard. Since the time is 1 μs or less in wireless LAN, it is necessary to create an idea so that the correction can be attained within such a short time.

Furthermore, a method wherein the receiver is maintained ON even during transmission, the transmission wave turning from the antenna switch to the reception section is received and demodulated, and the timing of the amplitude component and the phase component is corrected so that the bit error amount thereof becomes the lowest is available as a fourth method. With this method, high power is input to the reception section in the case when the isolation of the antenna switch is insufficient, whereby it is necessary to raise the linearity of the reception section.

Moreover, it is also considered to use combinations of these.

A direct modulation system for directly up-converting the base band I and Q signals into a high-frequency signal is used as the modulation circuit in this embodiment; however, as another system, it may be possible to use a direct modulation system wherein capacitance for attaining variable capacitance by using the voltage variable capacitance section, such as varactor diodes, of a voltage-controlled oscillator serving as a local oscillation signal source or by combining fixed capacitance having numerous capacitance values using MOS transistor switches is directly modulated by a base band signal whose wave is shaped.

In the direct modulation system, the circuit configuration is simplified, and low current consumption is attained; however, this system is not suited in the case when strict modulation accuracy is required. Furthermore, a system for up-converting the high-frequency signal via an intermediate frequency is also available, instead of the system for directly up-converting the I and Q signals into the high-frequency signal. Since the frequency of the local oscillation signal source differs from the frequency of the transmission wave in this system, it is possible to avoid a problem wherein the local oscillation signal source is affected by the transmission wave. However, the system is disadvantageous in current consumption and spurious suppression.

As described above, this embodiment adopts a configuration wherein the plurality of DC—DC converters 116 to 120 for converting the power supply voltage into the plurality of voltages having different values stepwise are provided, one of the DC—DC converters is selected depending on the level of the amplitude component, and the series regulator 129 converts the voltage of the amplitude component by using the output voltage of the selected DC—DC converter as the power supply voltage. Hence, the voltage drop due to the series regulator 129 at the time of voltage conversion can be lowered, whereby the loss due to the DC—DC converters can be decreased, and the power loss due to the series regulator 129 can also be decreased. Furthermore, since the series regulator 129 is used for voltage conversion, it is not necessary to use a low-pass filter at its output section, whereby broadband can be attained. Therefore, it is possible to attain the EER method in a wide frequency band without lowering efficiency.

Furthermore, since the series regulator 129 is used as linear voltage converting means, the voltage level can be controlled accurately by the feedback loop, whereby the amplitude component can be voltage-converted properly.

Still further, since the quadrature modulator 128 serving as frequency converting means is provided between the phase component output terminals of the phase/amplitude separating means 112 and the input terminal of the high-frequency power amplifier 130, the following effect can be obtained. Since the frequency band of the phase/amplitude separating means 112 is several hundred MHz at most, in the case when the carrier wave has a frequency exceeding 1 GHz, this cannot be processed; however, the frequency of the carrier wave can be up-converted easily by using frequency converting means, such as the quadrature modulator 128.

Embodiment 2

Figure 2:
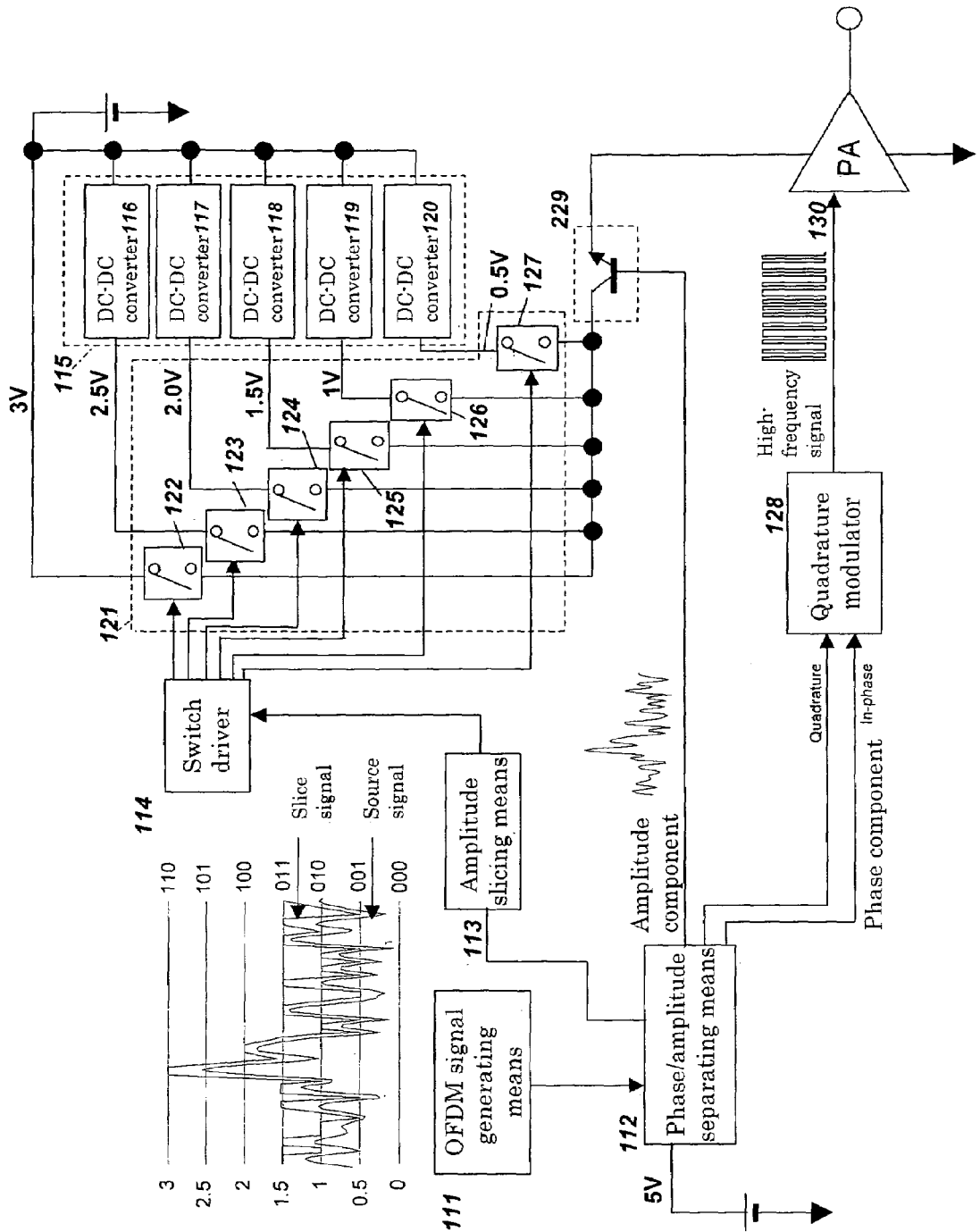
FIG. 2 is a block diagram showing the configuration of a transmitter in accordance with Embodiment 2 of the present invention.

FIG. 2 is a block diagram of a transmitter in accordance with Embodiment 2 of the present invention. This embodiment differs from Embodiment 1 in that an emitter follower 229 is used instead of the series regulator 129. Except for this, this embodiment is the same as Embodiment 6 in configuration and operation; hence, the components are designated by the same numerals and their explanations are omitted. The emitter follower 229 receives the outputs of the switch group 121 at the collector and applies the power supply voltage to the high-frequency power amplifier 130 on the basis of the voltage of the phase/amplitude separating means 112 having been input to the base.

An effect additionally obtained by using the emitter follower 229 is described below. In the case of the series regulator, a sufficient frequency band is not obtained in some cases owing to a phase delay due to the feedback loop or the like. On the other hand, in the case of using the emitter follower 229, the frequency band is limited by the frequency band determined by the characteristic of the transistor. However, since this limiting factor can allow a frequency band far wider than the conventional frequency band of 5 MHz to be attained, whereby the frequency band can sufficiently include a modulation band of up to 20 MHz for wireless LAN or the like.

Embodiment 3

Figure 3:
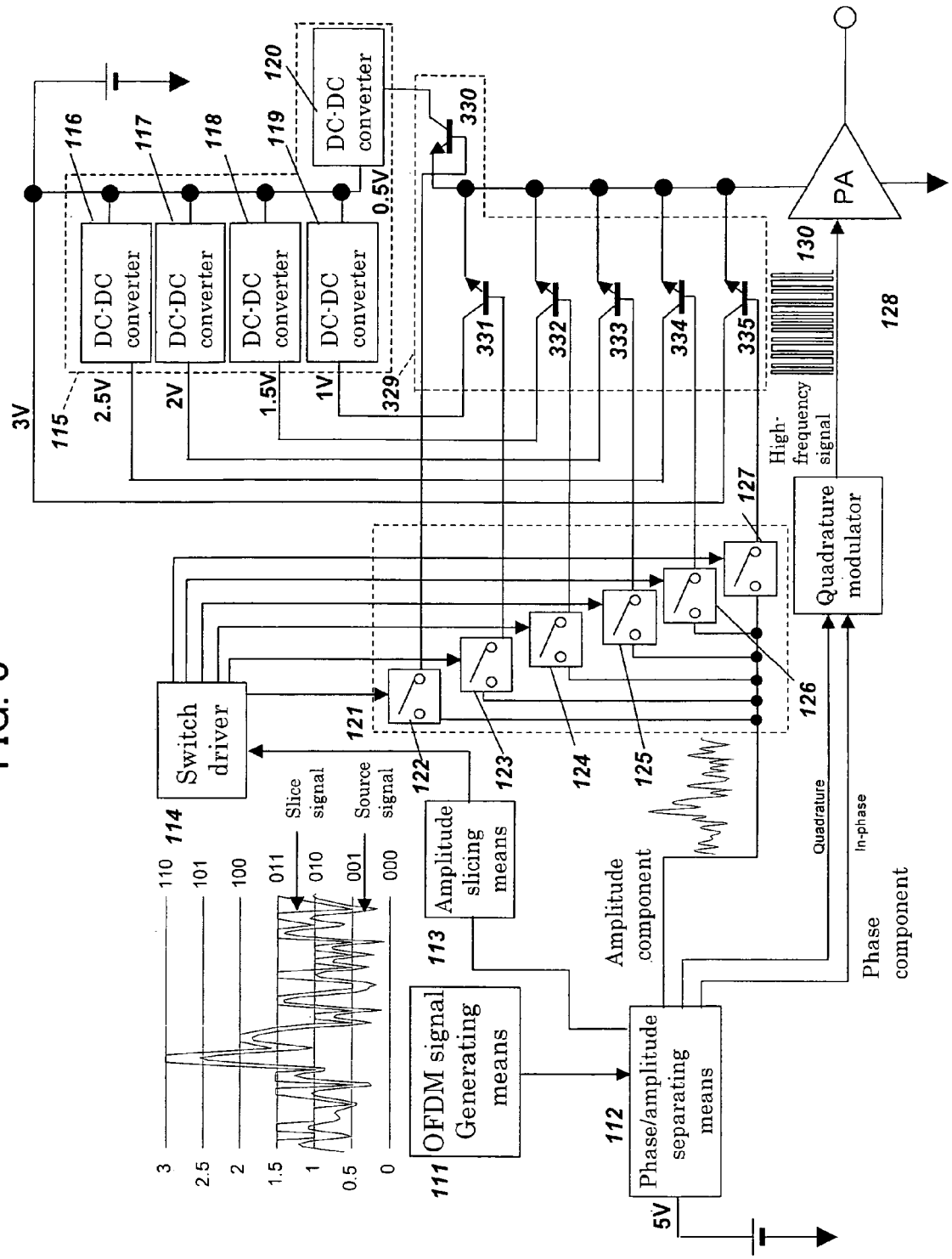
FIG. 3 is a block diagram showing the configuration of a transmitter in accordance with Embodiment 3 of the present invention.

FIG. 3 is a block diagram of a transmitter in accordance with Embodiment 8 of the present invention. This embodiment differs from Embodiments 1 and 2 in that the outputs from the power supply and the DC—DC converter group 115 are directly connected to the collectors of an emitter follower group 329 as many as the outputs, and that the bus connected to the base terminals of this emitter follower group 329 is switched by the switch group 121 comprising switches as many as the emitter followers of the emitter follower group 329. The same components as those of Embodiments 1 and 2 are designated by the same numerals and their explanations are omitted. The emitter follower group 329 corresponds to linear voltage converting means. It is preferable that the switch group 121 is formed of NMOS transistors. In addition, although this embodiment uses the plurality of emitter followers, an embodiment using series regulators instead of the emitter followers can also be devised in a way similar to that described above.

An additional effect expected in Embodiment 3 is that power loss can be decreased further in comparison with the configuration of Embodiment 1 since only the emitter followers 330 to 335 are provided between the DC—DC converter group 115 and the high-frequency power amplifier 130 and the switch group 121 is disconnected from the power supply path (the path from the power supply to the high-frequency power amplifier 130).

Embodiment 4

Embodiment 4 in accordance with the present invention will be described below referring to the drawing.

Figure 4:
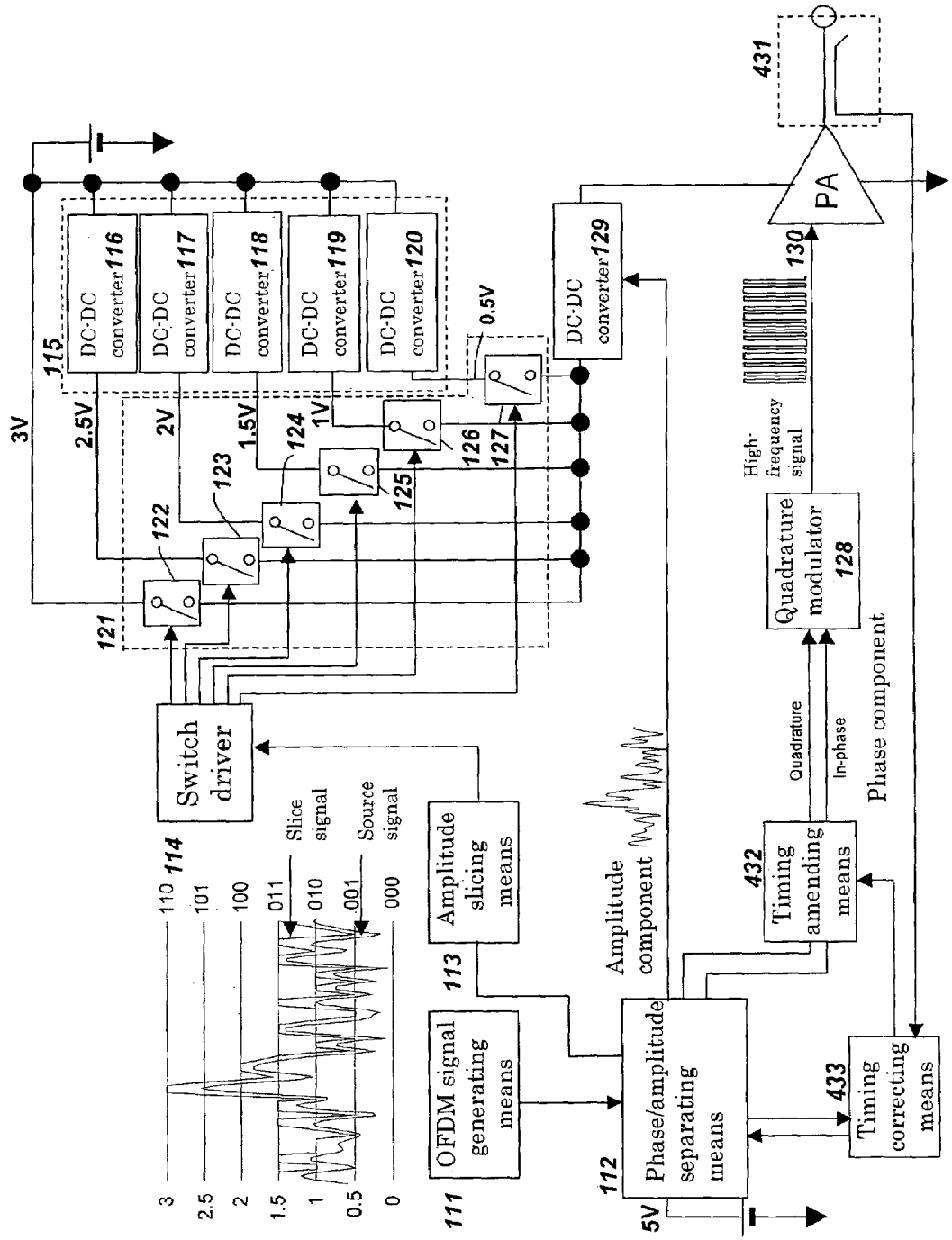
FIG. 4 is a block diagram showing the configuration of a transmitter in accordance with Embodiment 4 of the present invention.

FIG. 4 is a circuit diagram of a transmitter for attaining the EER method in accordance with Embodiment 4 of the present invention.

In this embodiment, the configuration described below is newly added to the configuration in accordance with Embodiment 1. In other words, a directional coupler 431 for obtaining high-frequency power, for example, is additionally provided at the output of the high-frequency power amplifier 130, timing correcting means 433 for extracting the amplitude component in the power obtained by the directional coupler 431 serving as feedback means by diode detection, for example, for comparing the amplitude component with the amplitude component from the phase/amplitude separating means 112, and for correcting the timing of the phase component and the amplitude component so that the error becomes as small as possible is provided, and timing amending means 432, such as delay circuit, for correcting the timing of the phase component, for example, on the basis of the correction data output from the timing correcting means 433 is provided.

Since the other configurations and operations are the same as those of Embodiment 1, their detailed explanations are omitted. In FIG. 4, numeral 111 designates OFDM signal generating means, numeral 113 designates amplitude slicing means, numeral 114 designates a switch driver, numeral 115 designates a switching regulator group, numerals 116 to 120 designate DC—DC converters, numeral 121 designates a switch group, numerals 122 to 127 designate switches, numeral 129 designates series regulators, and numeral 128 designates a quadrature modulator.

With this embodiment, the following effect is obtained. If the timing of the phase component and the amplitude component is deviated by a delay due to the layout from the input of each modulated wave component to the output of the high-frequency power amplifier 130 or a delay due to the wiring length and parasitic components of transistors, the original modulated wave cannot be reproduced properly. However, since the directional coupler 431, the timing correcting means 433 and the timing amending means 432 are provided, the timing of the phase component and the amplitude component can be amended accurately, whereby the modulated wave can be reproduced properly by using the output of the high-frequency power amplifier. The other effects are similar to those of Embodiment 1.

Embodiment 5

Embodiment 5 in accordance with the present invention will be described below referring to the drawing.

Figure 5:
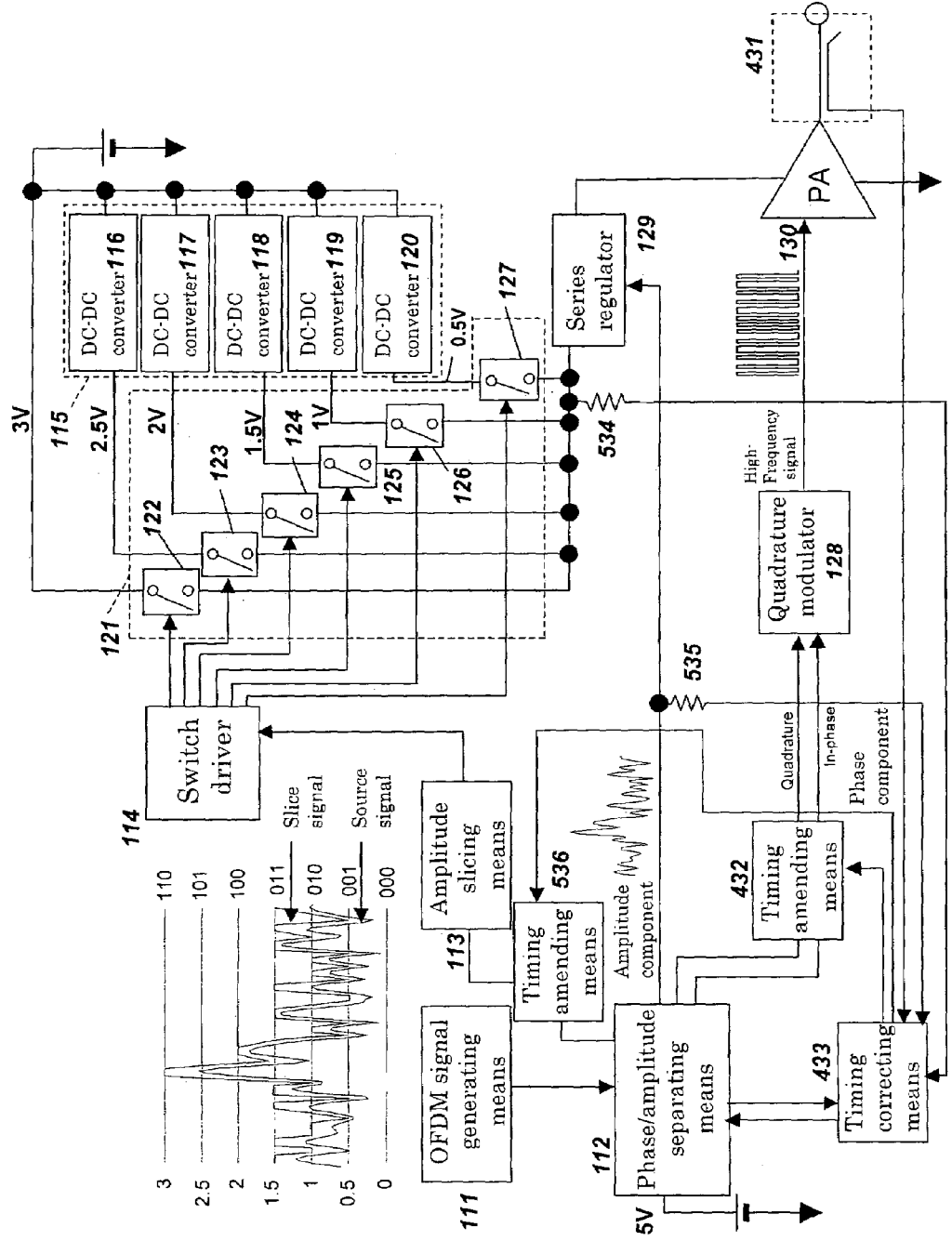
FIG. 5 is a block diagram showing the configuration of a transmitter in accordance with Embodiment 5 of the present invention.
Figure 6:
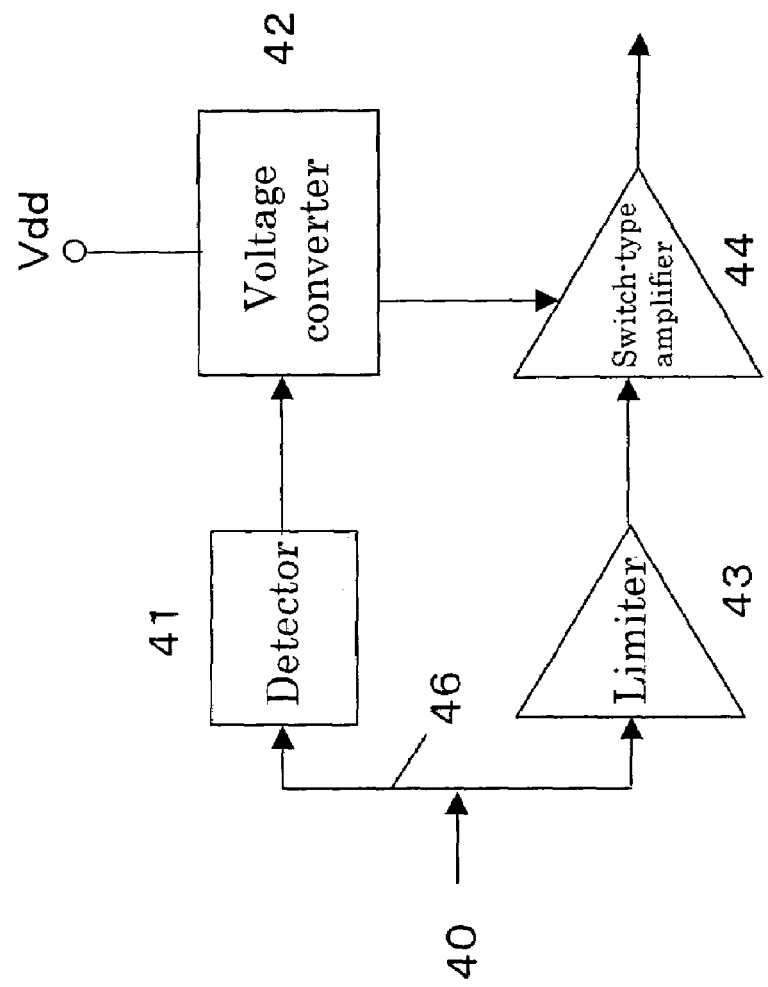
FIG. 6 is a block diagram showing the configuration of the conventional transmitter.

FIG. 5 is a circuit diagram of a transmitter for attaining the EER method in accordance with Embodiment 5 of the present invention.

In this embodiment, the configuration described below is newly added to the configuration in accordance with Embodiment 4. In other words, a resistor 534 of several kΩ, for example, serving as voltage detecting means is additionally provided at the terminal of the series regulator 129 to which the outputs of the DC—DC converters are input, and a resistor 535 of several kΩ, for example, serving as voltage detecting means is additionally provided at the terminal to which the amplitude component is input.

The level of the amplitude component and the output level of the DC—DC converter selected by the slice data are detected by the above-mentioned resistors 534 and 535. The timing correcting means 433 calculates the voltage difference between these and generates a timing adjustment signal so that the output of the DC—DC converter becomes a voltage suitable for the amplitude component.

Timing amending means 536, such as a delay circuit, for correcting the timing to the amplitude slicing means 113, for example, on the basis of the correction data (the timing adjustment signal) output from the timing correcting means 433 is newly added.

The other configurations and operations are the same as those of Embodiments 1 and 4, and their explanations are omitted. In FIG. 5, numeral 111 designates OFDM signal generating means, numeral 113 designates amplitude slicing means, numeral 114 designates a switch driver, numeral 115 designates a switching regulator group, numerals 116 to 120 designate DC—DC converters, numeral 121 designates a switch group, numerals 122 to 127 designate switches, numeral 128 designates a quadrature modulator, numeral 130 designates a high-frequency power amplifier, numeral 431 designates a directional coupler, and numeral 432 designates timing amending means.

With this embodiment, the following effect is obtained. If the timing of the amplitude slice data and the amplitude component is deviated by a delay due to the layout from each input of the amplitude slice data and the amplitude component to the output of the high-frequency power amplifier 130 or a delay due to the wiring length and parasitic components of transistors, the output of the switching regulator group 115 conducted by the switch driven according to the slice data is greatly deviated from the value of the amplitude component, whereby the efficiency is lowered or the series regulator 129 is turned OFF. However, since the resistors 534 and 535, the timing correcting means 433 and the timing amending means 536 are provided, the timing of the amplitude slice data and the amplitude component can be amended accurately, whereby ideal efficiency can be attained. The other effects are similar to those of Embodiment 1 or 4.

Embodiment 6

Embodiment 6 in accordance with the present invention will be described below referring to the drawing. In this embodiment, the wireless LAN system according to the IEEE802.11a Standard, wherein a wideband modulated signal is used, is taken as an example and explained. In the wireless LAN system, each of 52 quadrature subcarriers is subjected to 64-QAM modulation, and these are added to obtain a modulated signal. The 52 subcarriers are respectively spaced 312.5 kHz apart, thereby occupying 52×312.5=16.25 MHz.

Figure 7:
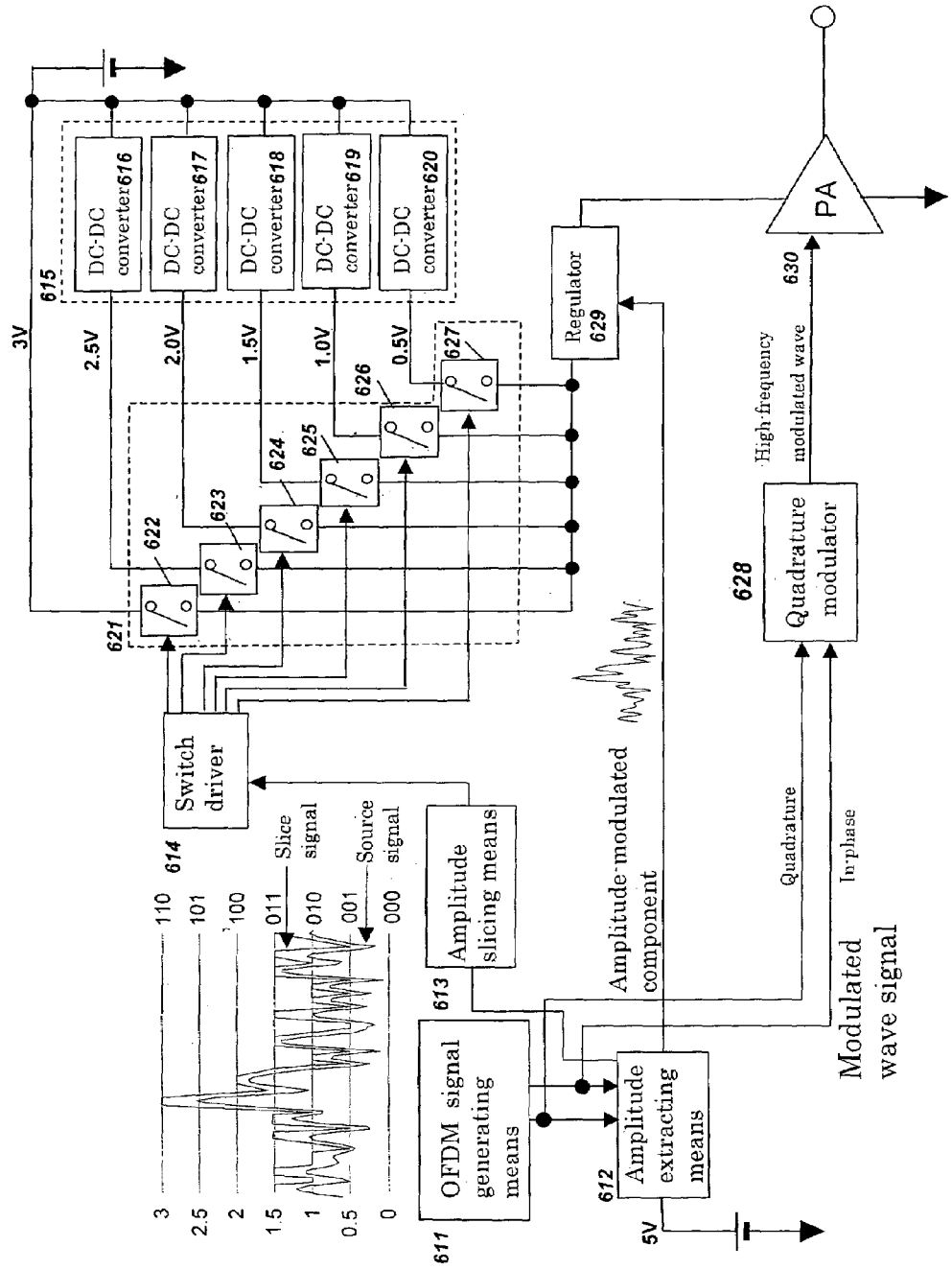
FIG. 7 is a block diagram showing the configuration of a transmitter in accordance with Embodiment 6 of the present invention.

FIG. 7 is a circuit diagram of a transmitter for attaining the EER method in accordance with Embodiment 6 of the present invention. As shown in FIG. 7, this transmitter comprises OFDM signal generating means 611, amplitude extracting means 612, amplitude slicing means 613, a switching regulator group 615, a switch group 621, a switch driver 614, a quadrature modulator 628, a series regulator 629, and a switch-type high-frequency power amplifier 630.

The above-mentioned OFDM signal generating means 611 corresponds to modulated signal generating means for generating a modulated signal.

The amplitude extracting means 612 extracts the amplitude component from the modulated signal generated by the OFDM signal generating means 611.

The amplitude slicing means 613 slices the amplitude component extracted by the amplitude extracting means 612 at a plurality of suitable voltage levels being different stepwise. As these voltage levels, 0.5, 1.0, 1.5, 2.0, 2.5 and 3.0 are set, for example. FIG. 7 shows the amplitude component that is input to the amplitude slicing means 613, that is, a source signal, and the output signal of the amplitude slicing means 613, that is, a slice signal.

The relationship between the source signal and the slice signal shown in FIG. 7 will be described herein. The amplitude slicing means 613 detects the amplitude level of the amplitude component as shown in FIG. 7, compares the level with a preset voltage level, and slices the amplitude component as shown in FIG. 7.

In an amplitude slicing method, for example, if the amplitude component is in the range of 0.5 V<the amplitude component≦1.0 V, it is rounded to 1 V; if 1.0 V<the amplitude component≦1.5 V, it is rounded to 1.5 V; and so on; the level is rounded to the maximum value in the range including the level. In the figure, seven levels in total are present; hence, these are assigned to 3-bit data, and 3-bit slice data is output to the switch driver 614.

The switching regulator group 615 comprises a plurality of, for example, five switching regulators to which a power supply voltage of 3 V, for example, is input, i.e., five DC—DC converters 616 to 620. The DC—DC converters 616 to 620 convert the power supply voltage into a plurality of voltages having different values stepwise. More specifically, the DC—DC converters 616 to 620 convert a voltage of 3 V into respective voltages of 2.5 V, 2.0 V, 1.5 V, 1.0 V and 0.5 V.

The switch group 621 comprises, for example, six switches 622 to 627, one of which is conducted selectively, thereby selecting one of 3 V serving as the power supply voltage, 2.5 V, 2.0 V, 1.5 V, 1.0 V and 0.5 V serving as the output voltages of the plurality of DC—DC converters 616 to 620. The switches 622 to 627 are each formed of an NPN transistor, for example, and its base voltage is switched by a MOS transistor, for example, thereby switching the outputs of the DC—DC converter group 615.

The switch driver 614 selectively conducts each of the switches 622 to 627 of the switch group 621 according to the slice data of the amplitude component sliced by the amplitude slicing means 613.

The quadrature modulator 628 multiplies the modulated signal output from the OFDM signal generating means 611 with the carrier wave to convert the modulated signal into a modulated wave, thereby corresponding to frequency converting means.

The series regulator (linear regulator) 629 operates by using one of the power supply voltage of 3 V and the output voltages of the switching regulators 616 to 620, selected by the switch group 621, as the power supply voltage, and converts the voltage of the amplitude component of the modulated signal, thereby corresponding to linear voltage converting means.

The high-frequency power amplifier (PA) 630 is a switch type; the modulated wave input from the quadrature modulator 628 is input to the high-frequency input terminal, and the amplitude component subjected to voltage conversion by the series regulator 629 is input to the power supply terminal; as a result, an amplified modulated wave is output.

The operation will be described below. In this embodiment, a system operating on a power supply voltage of 3 V is assumed to be used.

The amplitude component of the modulated signal generated by the OFDM signal generating means 611 is extracted by the amplitude extracting means 612 and then output. On the basis of the amplitude component having been output, the amplitude slicing means 613 generates drive information for ON/OFF driving the switches 622 to 627 of the switch group 621. The drive information is hereafter referred to as slice data.

In the amplitude slicing method, for example, if amplitude level of the amplitude component is in the range of 0 V<the amplitude level$\leq$0.5 V, it is rounded to 0.5 V;

if 0.5 V<the amplitude level$\leq$1.0 V, it is rounded to 1.0 V;

if 1.0 V<the amplitude level$\leq$1.5 V, it is rounded to 1.5 V;

if 1.5 V<the amplitude level$\leq$2.0 V, it is rounded to 2.0 V;

if 2.0 V<the amplitude level$\leq$2.5 V, it is rounded to 2.5 V; and if 2.5 V<the amplitude level$\leq$3.0 V, it is rounded to 3.0 V; in this way, a threshold value range in which the amplitude level is included is detected, and the level is rounded to the maximum value in the range including the level.

The rounding is carried out as described next. The DC—DC converters 616 to 620 are prepared so as to output the same output voltages (2.5 V, 2.0 V, 1.5 V, 1.0 V and 0.5 V) as the voltage levels obtained by the rounding. According to the level of the amplitude component, the amplitude slicing means 613 gives information as to the output of which one of the DC—DC converters 616 to 620 or the 3 V power supply should be made active to the switch driver 614. According to the given information, the switch driver 614 selectively turns ON/OFF the switches 622 to 627 provided in the output stages of the DC—DC converters 616 to 620 or the 3 V power supply, thereby outputting the voltage corresponding to the voltage obtained by the rounding.

More specifically, when the amplitude component is 1.1 V, the path of the DC—DC converter 618 is turned ON, and a voltage of 1.5 V is applied to the voltage input terminal of the series regulator 629. Similarly, when the amplitude component is 1.6 V, the path of the DC—DC converter 617 is turned ON, and a voltage of 2.0 V is applied to the voltage input terminal of the series regulator 629.

The amplitude component output from the amplitude extracting means 612 is input to the reference input terminal of the series regulator 629, whereby the output voltage of the series regulator 629 is modulated.

Furthermore, it is preferable that the amplitude component is output in a form synchronized with the slice data.

If the amplitude component is not synchronized with the slice data at this time, an unnecessarily large voltage drop occurs, whereby the power loss increases.

By attaining the above-mentioned operation, the voltage drop (the voltage difference between the output of the DC—DC converter and the output of the series regulator) of the series regulator 627 is held at a small value, whereby the power loss due to the series regulator 629 is lowered.

Furthermore, since the modulated signal is required to be frequency-converted into a modulated wave, it is input as I (in-phase) and Q (quadrature) signals to the quadrature modulator 628 and multiplied with the carrier wave.

In the high-frequency power amplifier 630, the amplitude component output from the series regulator 629 is input to the power supply terminal, and the modulated wave output from the quadrature modulator 628 is input to the high-frequency signal input terminal. Since a saturation-type amplifier is used for the high-frequency power amplifier 630, its output is saturated, and the amplitude component of the modulated wave is equalized by the output of the high-frequency power amplifier 630, whereby only the phase component is extracted. As a result, a modulated output in which the phase component and the amplitude component are multiplied is output at the output of the high-frequency power amplifier, whereby the original modulated wave is obtained.

When the amplitude component and the phase component are multiplied by the high-frequency power amplifier 630, it is preferable that the timing is not deviated.

Effects expected by the above-mentioned operation will be described below. It is assumed that the power loss at the DC—DC converters 616 to 620 is 96% and that the voltage drop of the switches 622 to 627 is 0.1 V. These values are based on the data of components actually available in the market. Furthermore, it is assumed that the efficiency of the switch-type high-frequency power amplifier 630 is 80%.

In the case of the wireless LAN IEEE802.11a Standard, it is assumed that the average output power is 13 dBm (20 mW); at this time, the peak power is the average power plus 7 dB, that is, 20 dB (100 mW). Hence, the high-frequency power amplifier 630 is required to output the peak power of 20 dBm. When it is assumed that the power efficiency (RF output power/applied DC power) of the high-frequency power amplifier 630 is 80%, the DC power PDC becomes 125 mW when the AC power PAC is the peak power of 100 mW (20 dBm). When the power supply voltage is 3 V at this time, a current of 41.7 mA is required at the peak time. The power supply voltage required for the high-frequency power amplifier 630 at the time of the average power is 1.3 V; however, since the DC power PDC is 25 mW when the average output power of the AC power PAC is 20 mW (13 dBm), a current of 19.2 mA is required.

The efficiency at the time of the average power, that is, an output of 20 mW, will be examined as described below.

When the power loss of the power supply section is examined, first, since the slice data is divided at intervals of 0.5 V, the voltage drop at the series regulator 629 is 0.5 V at the maximum; furthermore, when it is assumed that the saturation voltage VCE between the collector and the emitter of each of the switches (NPN transistors) 622 to 627 constituting the switch group 621 is 0.1 V, the power loss at the switch group 621 and the series regulator 629 is calculated as: 19.2 mA×0.6 V=11.5 mW.

In addition, since the power loss of the DC—DC converters 616 to 620 is 4%, the power loss at the DC—DC converters 616 to 620 is calculated as:

25 mW×0.04=1.0 mW.

Hence, the total power loss of the switch group 621, the series regulator 629 and the DC—DC converters 616 to 620 is calculated as:

11.5 mW+1.0 mW=12.5 mW.

As a result, the total efficiency at the time of the peak power is calculated as:

20 mW/(25 mW+12.5 mW)=53.3%.

The efficiency can be improved significantly in comparison with 10% at most in the case wherein an ordinary linear amplifier is used.

Furthermore, the voltage conversion section, wherein a DC—DC converter was conventionally used for modulation or the like, is configured so as to comprise the switching regulator group (DC—DC converters 616 to 620) for outputting constant voltages and the series regulator 629, whereby broadband, which was difficult to be attained by using only the DC—DC converter, can be attained. The reasons are described below.

In other words, the series regulator 629 is not required to be provided with a low-pass filter that limits a frequency band; hence, the problem wherein the frequency band is inevitably limited by the low-pass filter is solved, whereby the frequency band is limited by the other factors, for example, the frequency bands determined by the characteristics of the transistors in the series regulator 629, the phase delay due to the feedback loop, etc.

These limiting factors can allow a frequency band far wider than the conventional frequency band of 5 MHz to be attained, whereby the frequency band can sufficiently include a modulation band of up to 20 MHz for wireless LAN or the like.

In addition, a band-limiting filter may be provided at the output of the high-frequency power amplifier 630.

Furthermore, the DC—DC converters 616 to 620 are those provided with a low-pass filter at the output, and a low-pass filter for suppressing spurious components outside the range of the modulation frequency band may be provided between the output of the series regulator 629 and the power supply terminal of the high-frequency power amplifier 630.

Although it is preferable that the amplitude component is synchronized with the amplitude slice data as described above, no problem occurs provided that the output voltage of the series regulator 629 is adjusted so as not to be larger than the output voltages of the DC—DC converters 616 to 620, and for example, the slice data may be provided with a time allowance in advance so that the above-mentioned state does not occur even when there is a slight deviation in timing.

In addition, although it is preferable that the amplitude component and the phase component are input to the high-frequency power amplifier 630 in a synchronized state as described above, if the timing is deviated, the error vector magnitude of the transmission output becomes worse, thereby not satisfying the wireless standard. Hence, it is necessary to align the timing as much as possible by using the following methods.

A first method is a method wherein the timing is adjusted only at the time of production. With this method, it is not necessary to provide a feedback circuit or the like in the wireless circuit, whereby the wireless circuit can be simplified. However, synchronization may not be attained depending on the usage environment.

A second method is a method wherein the timing is adjusted only at the power ON time. This method can be adapted to the environment provided at the power ON time, thereby attaining more reliable synchronization than the first method. However, this causes a problem wherein communication cannot be carried out during the time required for correction.

In addition, in the case of wireless communication wherein transmission and reception are repeated alternately, such as wireless LAN, a method wherein the timing is adjusted by using the preamble period at the time of transmission start is available as a third method. This is the most ideal since it can be adapted to the environment one after another; however, the correction is required to be completed within a time sufficiently shorter than the preamble period. In the case of wireless LAN, the correction is required to be completed in about 1 μs.

Furthermore, a method wherein the receiver is maintained ON even during transmission, the transmission wave turning from the antenna switch to the reception section is received and demodulated, and the timing of the amplitude component and the phase component is corrected so that the error vector magnitude and the bit error amount thereof become the lowest is available as a fourth method. With this method, high power is input to the reception section in the case when the isolation of the antenna switch is insufficient, whereby it is necessary to raise the linearity of the reception section.

Moreover, it is also considered to use combinations of these.

As described above, this embodiment adopts a configuration wherein the plurality of DC—DC converters 616 to 620 for converting the power supply voltage into the plurality of voltages having different values stepwise are provided, one of the DC—DC converters is selected depending on the level of the amplitude component, and the series regulator 629 converts the voltage of the amplitude component by using the output voltage of the selected DC—DC converter as the power supply voltage. Hence, the voltage drop due to the series regulator 629 at the time of voltage conversion can be lowered, whereby the loss due to the DC—DC converters can be decreased, and the power loss due to the series regulator 629 can also be decreased. Furthermore, since the series regulator 629 is used for amplitude conversion, it is not necessary to use a low-pass filter at its output section, whereby broadband can be attained. Therefore, it is possible to attain the EER method in a wide frequency band without lowering efficiency.

Furthermore, since the series regulator 629 is used as linear voltage converting means, the voltage level can be controlled accurately by the feedback loop, whereby the amplitude component can be converted in level properly.

Moreover, since the modulated signal is directly used instead of the phase component, it is possible to avoid the deterioration of error vector magnitude (EVM), which was inevitable in the EER method wherein the modulated signal is separated into the amplitude and phase components. In other words, in the case when the phase component is used, the phase component is filtered in a range allowable by the frequency band of a digital-analog converter and to an extent not affecting EVM; however, a partial amplitude reduction in the phase component owing to the filtering causes significant deterioration in EVM when the phase component is combined with the amplitude component at the output of the high-frequency amplifier. In addition, since the required frequency band width of the modulated signal is less than that of the phase component separated from the modulated signal by about ⅙, the frequency band width of the digital-analog converter or an anti-alias filter for suppressing spurious components caused by digital-analog conversion can be narrowed. Hence, this is advantageous in decreasing the power consumption of the digital-analog converter and reducing the costs of the circuits used in the subsequent stages.

Furthermore, in the conventional EER method, since an input level, at which the high-frequency power amplifier can be saturated sufficiently even when the peak power is input, is introduced, in the case when the isolation characteristic at the time when the high-frequency power amplifier is OFF (the amplitude component is zero) is not good, the multiplication with the amplitude component is not carried out accurately, and the original modulated wave cannot be restored (the EVM performance deteriorates). In the configuration of this embodiment, when the high-frequency power amplifier is OFF (the amplitude component is zero), the power to be input to the high-frequency power amplifier is also zero, whereby the modulated wave can be restored properly without depending on the isolation characteristic.

Still further, in the configuration of this embodiment, the quadrature modulator 628 is used to convert the modulated signal into the modulated wave; however, the quadrature modulator 628 is not necessary in the case when the OFDM signal generating means 611 outputs the modulated wave. In this case, the amplitude extracting means 612 detects the amplitude of the modulated wave and extracts the amplitude component.

Embodiment 7

Figure 8:
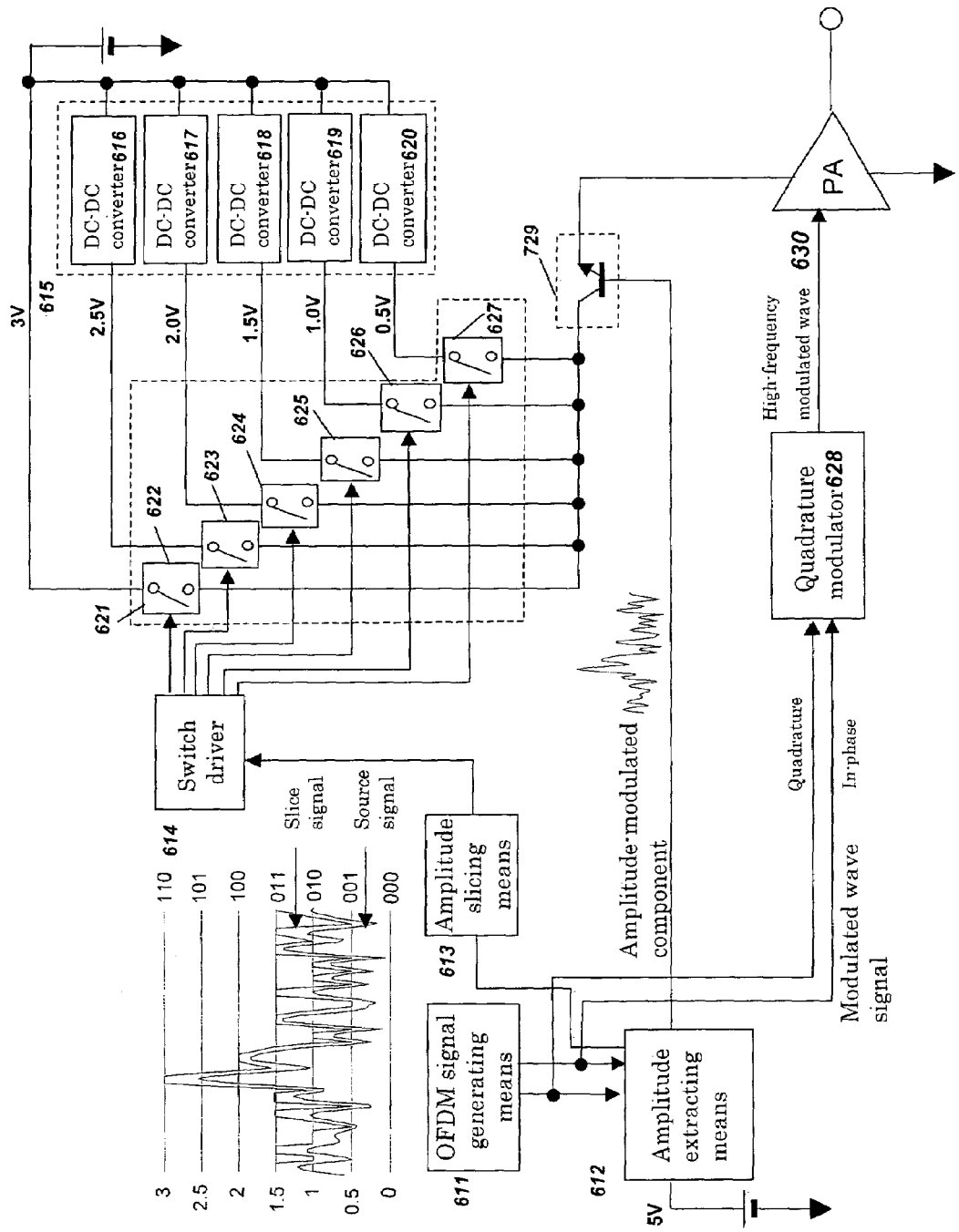
FIG. 8 is a block diagram showing the configuration of a transmitter in accordance with Embodiment 7 of the present invention.

FIG. 8 is a block diagram of a transmitter in accordance with Embodiment 7 of the present invention. This embodiment differs from Embodiment 6 in that an emitter follower 729 is used instead of the series regulator 629. Except for this, this embodiment is the same as Embodiment 6 in configuration and operation; hence, the components are designated by the same numerals and their explanations are omitted. The emitter follower 729 receives the outputs of the switch group 621 at the collector and applies the power supply voltage to the high-frequency power amplifier 630 on the basis of the voltage of the amplitude extracting means 612 having been input to the base.

An effect additionally obtained by using the emitter follower 729 is described below. In the case of the series regulator, a sufficient frequency band is not obtained in some cases owing to a phase delay due to the feedback loop or the like. On the other hand, in the case of using the emitter follower 729, the frequency band is limited by the frequency band determined by the characteristic of the transistor. However, since this limiting factor can allow a frequency band far wider than the conventional frequency band of 5 MHz to be attained, whereby the frequency band can sufficiently include a modulation band of up to 20 MHz for wireless LAN or the like.

Embodiment 8

Figure 9:
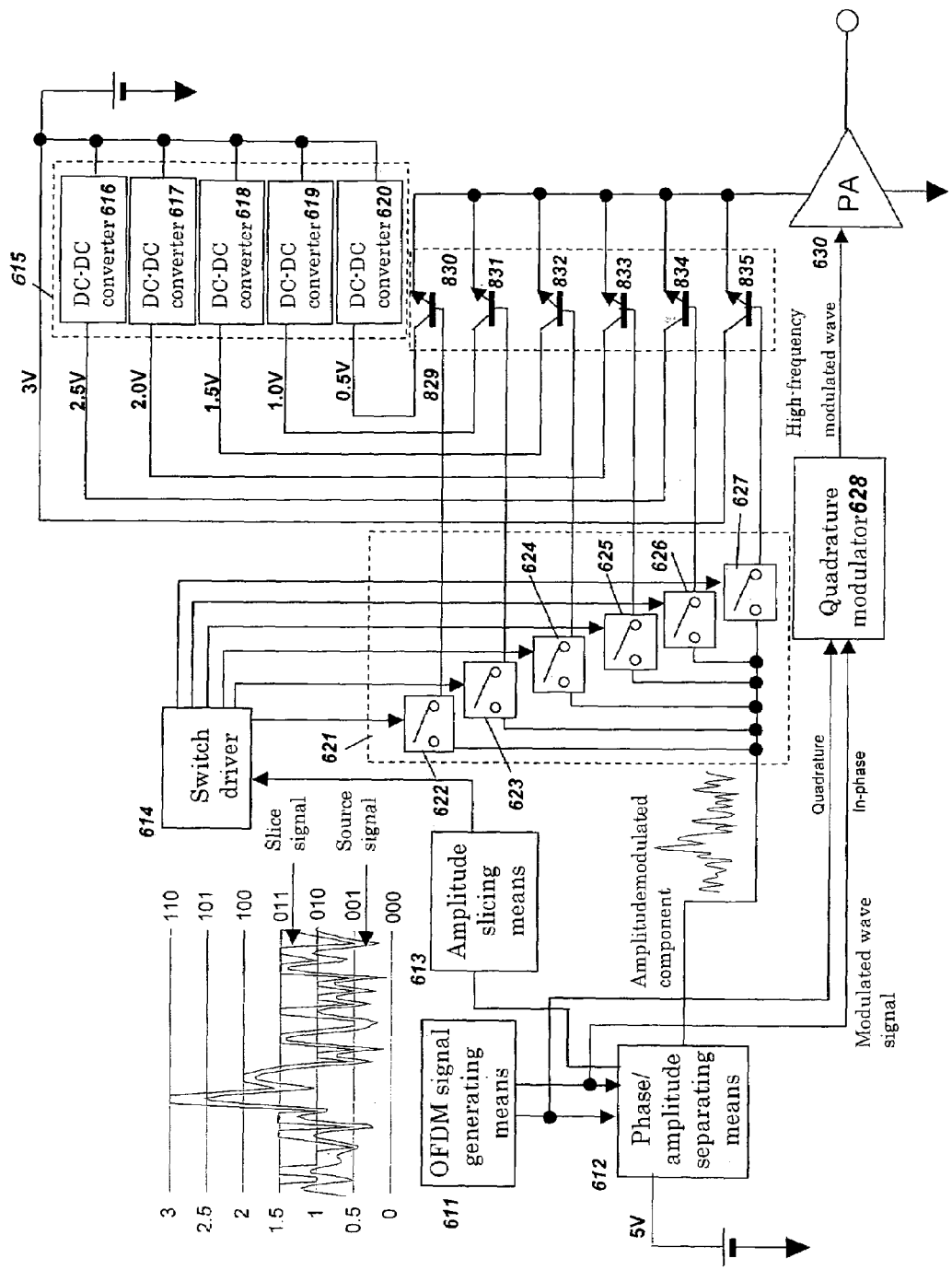
FIG. 9 is a block diagram showing the configuration of a transmitter in accordance with Embodiment 8 of the present invention.

FIG. 9 is a block diagram of a transmitter in accordance with Embodiment 8 of the present invention. This embodiment differs from Embodiments 6 and 7 in that the outputs from the power supply and the DC—DC converter group 615 are directly connected to the collectors of an emitter follower group 829 as many as the outputs, and that the bus connected to the base terminals of this emitter follower group 829 is switched by the switch group 621 comprising switches as many as the emitter followers of the emitter follower group 829. The same components as those of Embodiments 6 and 7 are designated by the same numerals and their explanations are omitted. The emitter follower group 829 corresponds to linear voltage converting means. It is preferable that the switch group 621 is formed of NMOS transistors. In addition, although this embodiment uses the plurality of emitter followers, an embodiment using series regulators instead of the emitter followers can also be devised in a way similar to that described above.

An additional effect expected in Embodiment 8 is that power loss can be decreased further in comparison with the configuration of Embodiment 6 since only the emitter followers 830 to 835 are provided between the DC—DC converter group 615 and the high-frequency power amplifier 630 and the switch group 621 is disconnected from the power supply path (the path from the power supply to the high-frequency power amplifier 630).

Embodiment 9

Figure 10:
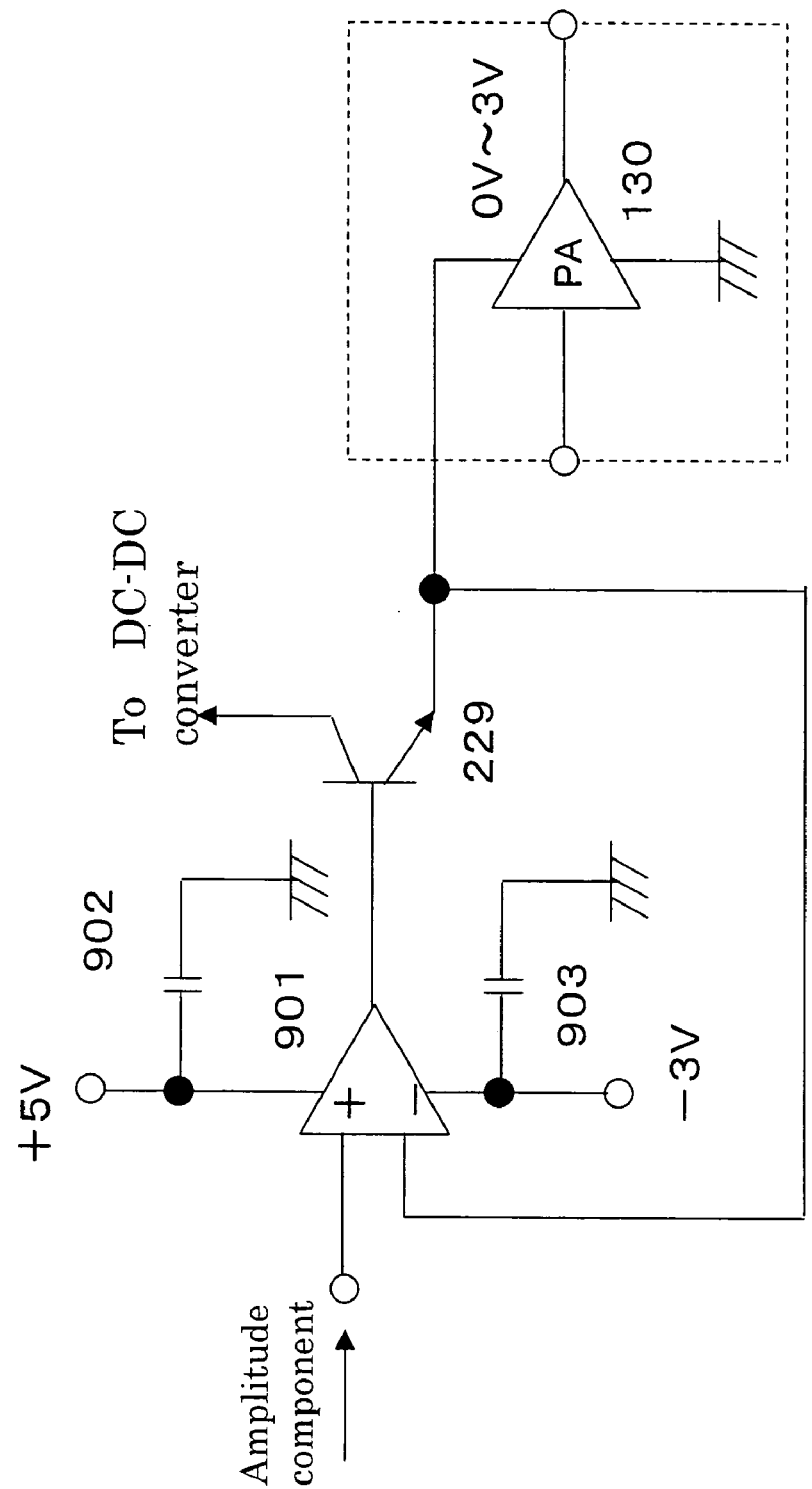
FIG. 10 is a block diagram showing the configuration of the main section of a transmitter in accordance with Embodiment 9 of the present invention.

FIG. 10 is a block diagram of the main section of a transmitter in accordance with Embodiment 9 of the present invention. In the transmitter in accordance with this embodiment, as shown in FIG. 10, the amplitude component output from a phase/amplitude separating means 112 is input to an operational amplifier 901, the output of the operational amplifier 901 is connected to the input (base) of an emitter follower 229, and the output (emitter) of the emitter follower 229 is fed back negatively to the operational amplifier 901. Numerals 902 and 903 respectively designate by-pass capacitors. The other components are similar to those shown in FIG. 2.

With this embodiment, the nonlinearity and the temperature characteristic of the emitter follower 229 can be compensated, and the amplitude component can be transmitted properly to the high-frequency power amplifier 130.

Embodiment 10

Figure 11:
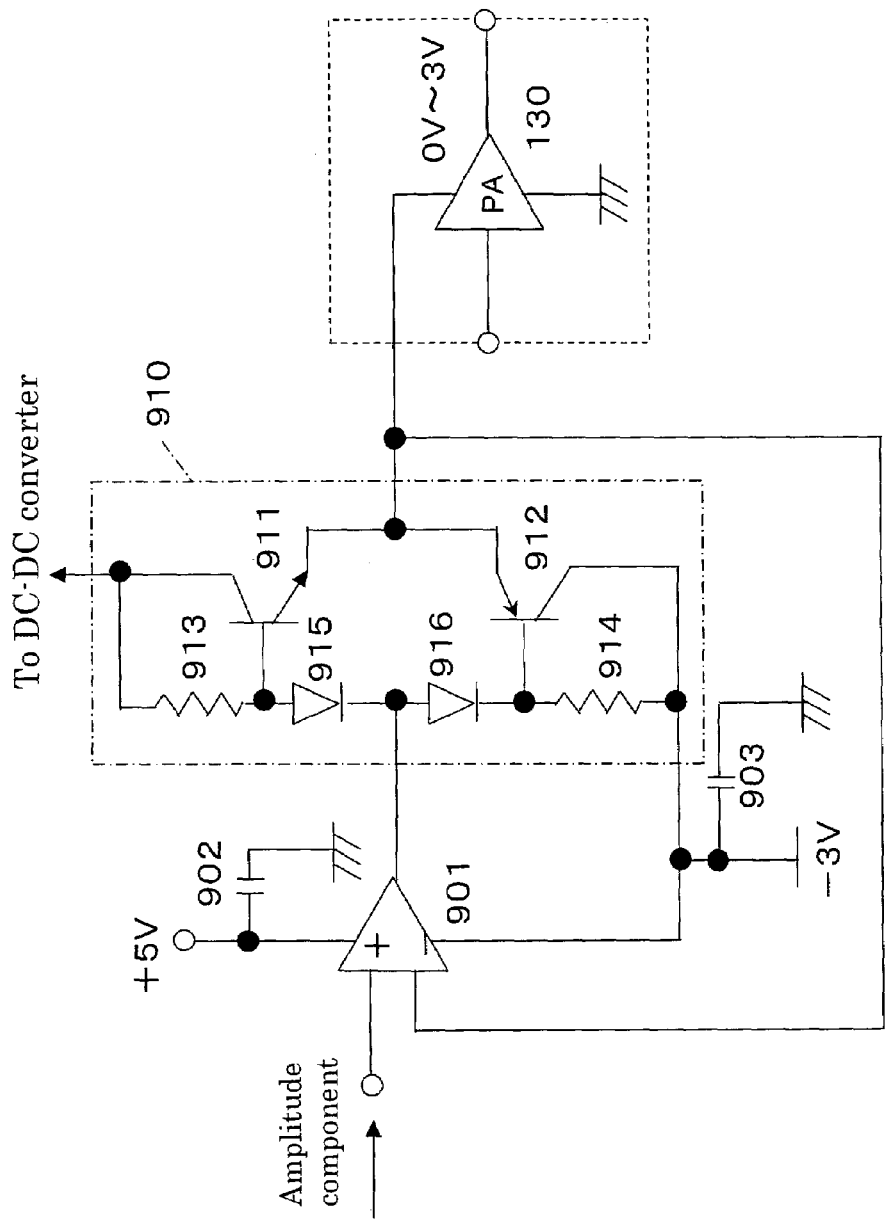
FIG. 11 is a block diagram showing the configuration of the main section of a transmitter in accordance with Embodiment 10 of the present invention.

FIG. 11 is a block diagram of the main section of a transmitter in accordance with Embodiment 10 of the present invention. In the transmitter in accordance with this embodiment, as shown in FIG. 11, an emitter follower 910 is not formed of only one transistor but formed of a push-pull circuit. Furthermore, in this transmitter, the amplitude component output from phase/amplitude separating means 112 is input to an operational amplifier 901, the output of the operational amplifier 901 is connected to the input of the emitter follower 910 serving as a push-pull circuit, and the output of the emitter follower 910 is fed back negatively to the operational amplifier 901. Numerals 902 and 903 respectively designate by-pass capacitors. Numerals 911 and 912 designate transistors, numerals 913 and 914 designate resistors, and numerals 915 and 916 designate diodes; these constitute the emitter follower. The other components are similar to those shown in FIG. 2.

In accordance with this embodiment, the nonlinearity and the temperature characteristic of the emitter follower 910 can be compensated, voltage holding at the positive or negative power supply voltage supplied to the operational amplifier owing to the transient characteristic of the operational amplifier 901 can be prevented, and the amplitude component can be transmitted properly to the high-frequency power amplifier 233.

Embodiment 11

Figure 12:
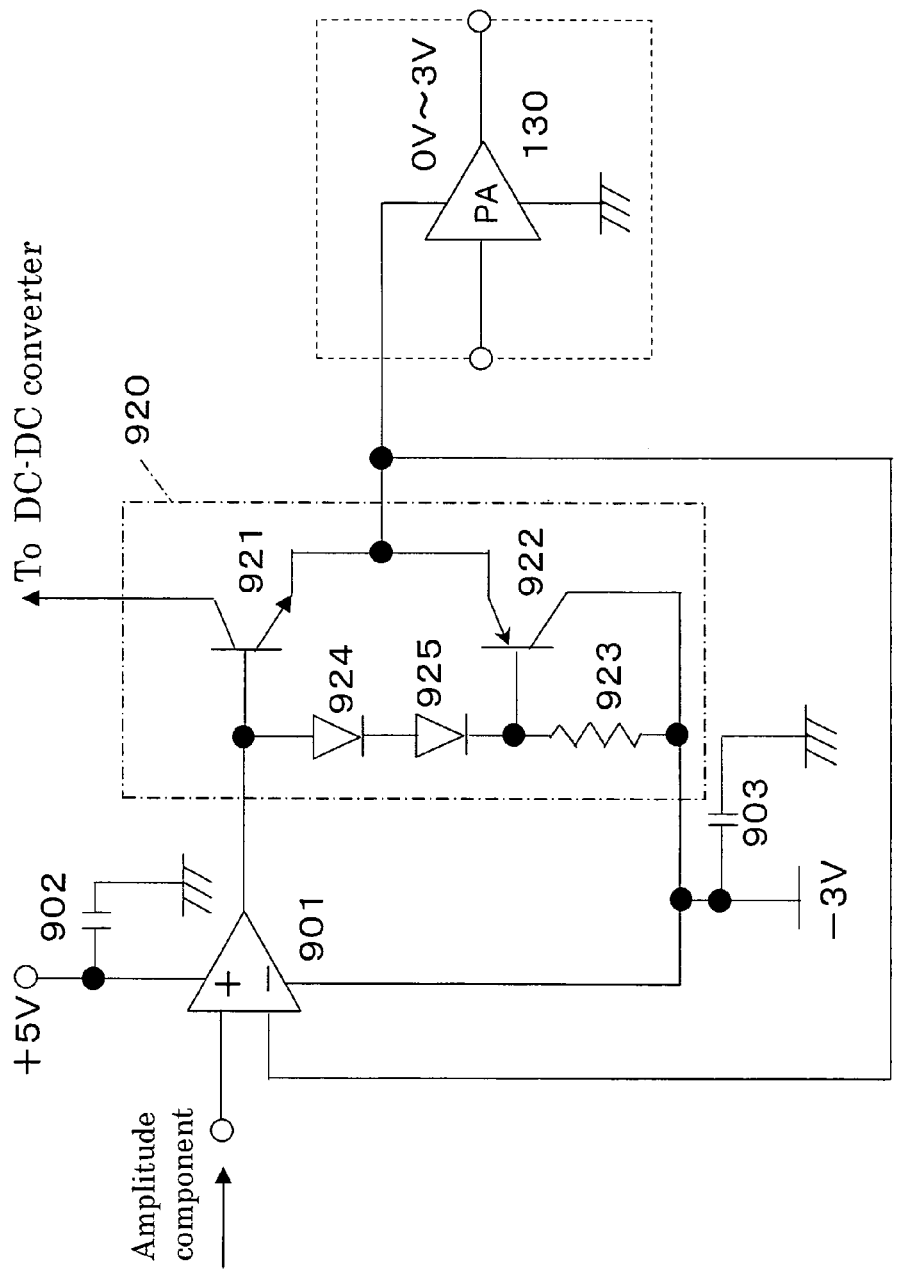
FIG. 12 is a block diagram showing the configuration of the main section of a transmitter in accordance with Embodiment 11 of the present invention.

FIG. 12 is a block diagram of the main section of a transmitter in accordance with Embodiment 11 of the present invention. In the transmitter in accordance with this embodiment, as shown in FIG. 12, an emitter follower 920 is formed of a push-pull circuit. Furthermore, in this transmitter, the amplitude component output from phase/amplitude separating means 112 is input to an operational amplifier 901, the output of the operational amplifier 901 is connected to the input of the emitter follower 920 serving as a push-pull circuit, and the output of the emitter follower 920 is fed back to the operational amplifier 901. Numerals 902 and 903 respectively designate by-pass capacitors. Numerals 921 and 922 designate transistors, numeral 923 designates a resistor, and numerals 924 and 925 designate diodes; these constitute the emitter follower. The other components are similar to those shown in FIG. 2.

This embodiment has an operation-effect similar to that of Embodiment 10.

The configurations described in the above-mentioned Embodiments 9, 10 and 11 can also be applied respectively to the transmitter circuit shown in FIG. 8; in that case, effects similar to those of Embodiments 9, 10 and 11 are obtained.

INDUSTRIAL APPLICABILITY

The transmitter in accordance with the present invention has an effect of attaining highly efficient operation in a wide frequency band in the EER method capable of operating a high-frequency power amplifier as a switch type, thereby being useful as a transmitter or the like conforming to a communication system using subcarriers, such as OFDM (Orthogonal Frequency Division Multiplex).

The invention claimed is:

1. A transmitter comprising:
   modulated signal generating means for generating a modulated signal,
   phase/amplitude separating means for separating said modulated signal generated by said modulated signal generating means into a phase component and an amplitude component,
   amplitude slicing means for slicing said amplitude component separated by said phase/amplitude separating means at a plurality of voltage levels being different stepwise,
   a plurality of switching regulators for converting the power supply voltage into a plurality of voltages having different values stepwise,
   a switch group for selecting one of the output voltages of said plurality of switching regulators,
   a switch driver for selectively conducting each switch of said switch group according to the slice data of the amplitude component sliced by said amplitude slicing means,
   linear voltage converting means for voltage-converting said amplitude component by using the output voltage of one of the switching regulators selected by said switch group as the power supply voltage, and a
   high-frequency power amplifier for receiving said phase component at the high-frequency input terminal thereof, for receiving the amplitude component voltage-converted by said linear voltage converting means at the power supply terminal thereof and for, as a result, outputting a modulated wave in which amplitude and phase are multiplied.

2. A transmitter in accordance with claim 1, wherein frequency converting means is provided between the phase component output terminal of said phase/amplitude separating means and the input terminal of said high-frequency power amplifier.

3. A transmitter in accordance with claim 1, further comprising:
   feedback means, provided at the output terminal of said high-frequency power amplifier, for feeding back the high-frequency output power,
   first timing correcting means for generating a first correction signal for correcting the timing deviation of phase and amplitude on the basis of the signal of said feedback means, and
   first timing amending means for receiving said first correction signal from said first timing correcting means and for amending the timing of said amplitude component and said phase component output from said phase/amplitude separating means.

4. A transmitter in accordance with claim 1, further comprising:
   first voltage detecting means, provided between the output terminal of said switching regulator and the power supply voltage input terminal of said linear voltage converting means, for detecting the output voltage of said switching regulator,
   second voltage detecting means, provided at the amplitude component input terminal of said linear voltage converting means, for detecting the voltage of said amplitude component,
   second timing correcting means for outputting a second correction signal for correcting the timing deviation of said amplitude component and said slice data by comparing the voltage amplitude data obtained from said first and second voltage detecting means, and
   second timing amending means for receiving said second correction signal from said second timing correcting means and for amending the timing of said amplitude component and said slice data.

5. A transmitter in accordance with claim 1, wherein said linear voltage converting means is an emitter follower.

6. A transmitter in accordance with claim 5, wherein said amplitude component is input to an operational amplifier, the output of said operational amplifier is connected to the input of said emitter follower, and the output of said emitter follower is fed back negatively to said operational amplifier.

7. A transmitter in accordance with claim 5, wherein said emitter follower is formed of a push-pull circuit, said amplitude component is input to an operational amplifier, the output of said operational amplifier is connected to the input of said push-pull circuit, and the output of said push-pull circuit is fed back negatively to said operational amplifier.

8. A transmitter in accordance with claim 1, wherein said linear voltage converting means is a linear regulator.

9. A transmitter comprising:
   modulated signal generating means for generating a modulated signal, phase/amplitude separating means for separating said modulated signal generated by said modulated signal generating means into a phase component and an amplitude component, amplitude slicing means for slicing said amplitude component separated by said phase/amplitude separating means at a plurality of voltage levels being different stepwise, a plurality of switching regulators for converting the power supply voltage into a plurality of voltages having different values stepwise, a plurality of linear voltage converting means for voltage-converting said amplitude component by using each of the output voltages of the plurality of switching regulators as the power supply voltage, a switch group for transmitting said amplitude component to said plurality of linear voltage converting means, a switch driver for selectively conducting each switch of said switch group according to the slice data of the amplitude component sliced by said amplitude slicing means, and a high-frequency power amplifier for receiving said phase component at the high-frequency input terminal thereof, for receiving the amplitude component voltage-converted by said plurality of linear voltage converting means at the power supply terminal thereof and for, as a result, outputting a modulated wave in which amplitude and phase are multiplied.

10. A transmitter in accordance with claim 9, wherein frequency converting means is provided between the phase component output terminal of said phase/amplitude separating means and the input terminal of said high-frequency power amplifier.

11. A transmitter in accordance with claim 9, further comprising:

feedback means, provided at the output terminal of said high-frequency power amplifier, for feeding back the high-frequency output power, first timing correcting means for generating a first correction signal for correcting the timing deviation of phase and amplitude on the basis of the signal of said feedback means, and first timing amending means for receiving said first correction signal from said first timing correcting means and for amending the timing of said amplitude component and said phase component output from said phase/amplitude separating means.

12. A transmitter in accordance with claim 9, further comprising:

first voltage detecting means, provided between the output terminal of said switching regulator and the power supply voltage input terminal of said linear voltage converting means, for detecting the output voltage of said switching regulator, second voltage detecting means, provided at the amplitude component input terminal said linear voltage converting means, for detecting the voltage of said amplitude component, second timing correcting means for outputting a second correction signal for correcting the timing deviation of said amplitude component and said slice data by comparing the voltage amplitude data obtained from said first and second voltage detecting means, and second timing amending means for receiving said second correction signal from said second timing correcting means and for amending the timing of said amplitude component and said slice data.

13. A transmitter in accordance with claim 9, wherein said linear voltage converting means is an emitter follower.

14. A transmitter in accordance with claim 13, wherein said amplitude component is input to an operational amplifier, the output of said operational amplifier is connected to the input of said emitter follower, and the output of said emitter follower is fed back negatively to said operational amplifier.

15. A transmitter in accordance with claim 13, wherein said emitter follower is formed of a push-pull circuit, said amplitude component is input to an operational amplifier, the output of said operational amplifier is connected to the input of said push-pull circuit, and the output of said push-pull circuit is fed back negatively to said operational amplifier.

16. A transmitter in accordance with claim 9, wherein said linear voltage converting means is a linear regulator.

17. A transmitter comprising:

modulated signal generating means for generating a modulated signal, amplitude extracting means for extracting an amplitude component from said modulated signal generated by said modulated signal generating means, amplitude slicing means for slicing said amplitude component extracted by said amplitude extracting means at a plurality of voltage levels being different stepwise, a plurality of switching regulators for converting the power supply voltage into a plurality of voltages having different values stepwise, a switch group for selecting one of the output voltages of said plurality of switching regulators, a switch driver for selectively conducting each switch of said switch group according to the slice data of the amplitude component sliced by said amplitude slicing means, linear voltage converting means for voltage-converting said amplitude component by using the output voltage of one of said switching regulators selected by said switch group as the power supply voltage, and a high-frequency power amplifier for receiving said modulated signal at the high-frequency input terminal thereof, for receiving the amplitude component voltage-converted by said linear voltage converting means at the power supply terminal thereof and for, as a result, outputting a modulated wave.

18. A transmitter in accordance with claim 17, wherein said linear voltage converting means is an emitter follower.

19. A transmitter in accordance with claim 18, wherein said amplitude component is input to an operational amplifier, the output of said operational amplifier is connected to the input of said emitter follower, and the output of said emitter follower is fed back negatively to said operational amplifier.

20. A transmitter in accordance with claim 18, wherein said emitter follower is formed of a push-pull circuit, said amplitude component is input to an operational amplifier, the output of said operational amplifier is connected to the input of said push-pull circuit, and the output of said push-pull circuit is fed back negatively to said operational amplifier.

21. A transmitter in accordance with claim 17, wherein said linear voltage converting means is a linear regulator.

22. A transmitter comprising:

modulated signal generating means for generating a modulated signal, amplitude extracting means for extracting an amplitude component from said modulated signal generated by said modulated signal generating means, amplitude slicing means for slicing said amplitude component extracted by said amplitude extracting means at a plurality of voltage levels being different stepwise, a plurality of switching regulators for converting the power supply voltage into a plurality of voltages having different values stepwise, a plurality of linear voltage converting means for voltage-converting said amplitude component by using each of the output voltages of said plurality of switching regulators as the power supply voltage, a switch group for transmitting said amplitude signal to said plurality of linear voltage converting means, a switch driver for selectively conducting each switch of said switch group according to the slice data of the amplitude component sliced by said amplitude slicing means, and a high-frequency power amplifier for receiving said modulated signal at the high-frequency input terminal thereof, for receiving the amplitude component voltage-converted by said plurality of linear voltage converting means at the power supply terminal thereof and for, as a result, outputting a modulated wave.

23. A transmitter in accordance with claim 22, wherein said linear voltage converting means is an emitter follower.

24. A transmitter in accordance with claim 23, wherein said amplitude component is input to an operational amplifier, the output of said operational amplifier is connected to the input of said emitter follower, and the output of said emitter follower is fed back negatively to said operational amplifier.

25. A transmitter in accordance with claim 23, wherein said emitter follower is formed of a push-pull circuit, said amplitude component is input to an operational amplifier, the output of said operational amplifier is connected to the input of said push-pull circuit, and the output of said push-pull circuit is fed back negatively to said operational amplifier.

26. A transmitter in accordance with claim 22, wherein said linear voltage converting means is a linear regulator.

* * * * *